(12) United States Patent
Hwang et al.

(10) Patent No.: US 12,200,920 B2
(45) Date of Patent: Jan. 14, 2025

(54) INTEGRATED CIRCUIT DEVICES INCLUDING A POWER DISTRIBUTION NETWORK AND METHODS OF FORMING THE SAME

(71) Applicant: Samsung Electronics Co., Ltd., Suwon-si (KR)

(72) Inventors: Inchan Hwang, Schenectady, NY (US); Jaemyung Choi, Niskayuna, NY (US); Kang-Ill Seo, Albany, NY (US)

(73) Assignee: Samsung Electronics Co., Ltd. (KR)

( * ) Notice: Subject to any disclaimer, the term of this patent is extended or adjusted under 35 U.S.C. 154(b) by 173 days.

(21) Appl. No.: 17/816,809

(22) Filed: Aug. 2, 2022

(65) Prior Publication Data

US 2023/0354570 A1    Nov. 2, 2023

Related U.S. Application Data

(60) Provisional application No. 63/335,960, filed on Apr. 28, 2022.

(51) Int. Cl.
| | | |
|---|---|---|
| *G11C 16/04* | (2006.01) | |
| *G11C 11/412* | (2006.01) | |
| *G11C 11/419* | (2006.01) | |
| *H10B 10/00* | (2023.01) | |

(52) U.S. Cl.
CPC ............ *H10B 10/12* (2023.02); *G11C 11/412* (2013.01); *G11C 11/419* (2013.01); *H10B 10/18* (2023.02)

(58) Field of Classification Search
CPC .............................. G11C 11/412; G11C 11/419
See application file for complete search history.

(56) References Cited

U.S. PATENT DOCUMENTS

| | | | |
|---|---|---|---|
| 7,420,857 B2* | 9/2008 | Hirota | G11C 11/417 365/189.09 |
| 7,635,988 B2* | 12/2009 | Madurawe | G11C 11/412 326/40 |
| 7,723,806 B2* | 5/2010 | Liaw | H10B 10/12 257/311 |
| 8,595,661 B2 | 11/2013 | Kawa et al. | |
| 10,453,850 B2 | 10/2019 | Smith et al. | |
| 10,770,479 B2 | 9/2020 | Smith et al. | |
| 11,217,528 B2 | 1/2022 | Peng et al. | |
| 11,244,949 B2 | 2/2022 | Weckx et al. | |
| 11,264,486 B2 | 3/2022 | Chu et al. | |
| 2021/0272895 A1 | 9/2021 | Wu et al. | |

* cited by examiner

*Primary Examiner* — Pho M Luu
(74) *Attorney, Agent, or Firm* — Myers Bigel, P.A.

(57) ABSTRACT

Integrated circuit devices and methods of forming the same are provided. The integrated circuit devices may include a static random access memory (SRAM) unit. The SRAM unit may include a first inverter on a substrate and a power distribution network (PDN) structure including a first power rail and a second power rail. The substrate may extend between the first inverter and the PDN structure. The first inverter may include a first upper transistor including a first upper source/drain region, a first lower transistor between the substrate and the first upper transistor and including a first lower source/drain region, a first power contact extending through the substrate and electrically connecting the first upper source/drain region to the first power rail, and a second power contact extending through the substrate and electrically connecting the first lower source/drain region to the second power rail.

23 Claims, 21 Drawing Sheets

INTEGRATED CIRCUIT DEVICES INCLUDING A POWER DISTRIBUTION NETWORK AND METHODS OF FORMING THE SAME

CROSS-REFERENCE TO RELATED APPLICATION

This application claims priority to U.S. Provisional Application Ser. No. 63/335,960, entitled CONTACT CONFIGURATION IN STACKED DEVICES INCLUDING BACKSIDE POWER DISTRIBUTION NETWORK SCHEME, filed in the USPTO on Apr. 28, 2022, the disclosure of which is hereby incorporated by reference herein in its entirety.

BACKGROUND

The present disclosure generally relates to the field of electronics and, more particularly, to integrated circuit devices including a power distribution network.

Various structures of an integrated circuit device and methods of forming the same have been proposed to increase the integration density thereof. Specifically, an integrated circuit device including elements formed in a substrate or on a backside of the substrate has been proposed to simplify the back-end-of-line (BEOL) portion of device fabrication.

SUMMARY

According to some embodiments, integrated circuit devices may include a static random access memory (SRAM) unit comprising: a first inverter on a substrate; and a power distribution network (PDN) structure comprising a first power rail and a second power rail. The substrate extends between the first inverter and the PDN structure. The first inverter comprises: a first upper transistor comprising a first upper source/drain region; a first lower transistor between the substrate and the first upper transistor and comprising a first lower source/drain region, wherein the first upper source/drain region overlaps the first lower source/drain region in a vertical direction; a first power contact extending through the substrate and electrically connecting the first upper source/drain region to the first power rail; and a second power contact extending through the substrate and electrically connecting the first lower source/drain region to the second power rail.

According to some embodiments, integrated circuit devices may include a static random access memory (SRAM) unit comprising a first inverter and a third inverter on a substrate; and a shared contact in the substrate. The first inverter comprises: a first upper transistor comprising a first upper gate electrode; and a first lower transistor between the substrate and the first upper transistor and comprising a first lower gate electrode that is electrically connected to the first upper gate electrode. The third inverter comprises: a third upper transistor comprising a fifth upper source/drain region; and a third lower transistor between the substrate and the third upper transistor and comprising a fifth lower source/drain region that is electrically connected to the fifth upper source/drain region. The shared contact electrically connects the first lower gate electrode to the fifth lower source/drain region.

According to some embodiments, methods of forming an integrated circuit devices may include forming a first static random access memory (SRAM) unit comprising a first inverter and a second SRAM unit comprising a second inverter on a front side of a substrate. The first inverter comprises: a first upper transistor comprising a first upper source/drain region; and a first lower transistor between the substrate and the first upper transistor and comprising a first lower source/drain region. The second inverter comprises: a second upper transistor comprising a third upper source/drain region; and a second lower transistor between the substrate and the second upper transistor and comprising a third lower source/drain region. The methods may further includes forming a source/drain connector on the first upper source/drain region and the third upper source/drain region, wherein the source/drain connector electrically connects the first upper source/drain region to the third upper source/drain region; performing an etch process on a back side of the substrate, thereby forming first and second openings that extend through the substrate; forming a first power contact and a second power contact in the first opening and the second opening, respectively, wherein the first power contact is electrically connected to the source/drain connector, and the second power contact is electrically connected to the first lower source/drain region; and forming a power distribution network (PDN) structure on the first power contact and the second power contact, wherein the PDN structure comprises a first power rail electrically connected to the first power contact and a second power rail electrically connected to the second power contact.

DETAILED DESCRIPTION

Various integrated circuit devices include an inverter that includes two transistors having different conductivity types. For example, a static random access memory (SRAM) may include a pair of inverters. A stacked transistor structure in which an upper transistor and a lower transistor are stacked may be used to form an inverter to reduce an area and/or to simplify interconnections between those two transistors. The reduced area of the inverter may result in an increase in a number of metal wires (e.g., a wordline, a bit-line and a power rail) of a back-end structure per a unit area, and those metal wires may be provided at multiple levels and/or may have non-linear shapes to be arranged in the reduced area.

According to some embodiments, only a first group of metal wires (e.g., a wordline and a bit-line) may be provided in a back-end structure, and a second group of metal wires (e.g., a power rail) may be provided in a power distribution network (PDN) structure that is on a back side of a substrate. This configuration may simplify layouts of the back-end structure and each of the metal wires may have a linear shape.

Figure 1:
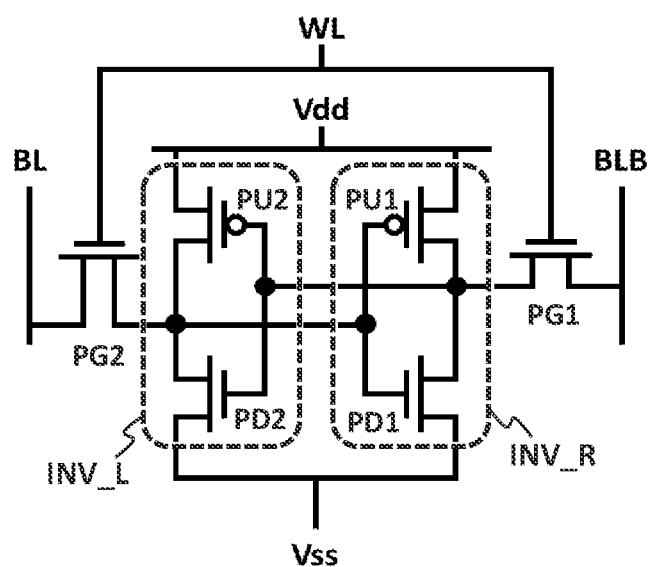
FIG. 1 is a circuit diagram of a static random access memory (SRAM).

FIG. 1 is a circuit diagram of an SRAM. The SRAM may include an SRAM unit including six transistors (i.e., first and second pull-up transistors PU1 and PU2, first and second pull-down transistors PD1 and PD2, and first and second path gate transistors PG1 and PG2). The SRAM may also include a word line WL, bit lines BL and BLB, and two power lines electrically connected to a first power having a first voltage (e.g., a drain voltage Vdd) and a second power having a second voltage (e.g., a source voltage Vss). The first pull-up transistor PU1 and the first pull-down transistor PD1 constitute a right-side inverter INV_R, and the second pull-up transistor PU2 and the second pull-down transistor PD2 constitute a left-side inverter INV_L. In some embodiments, each of the first and second pull-up transistors PU1 and PU2 may be a first conductivity type transistor (e.g., a PMOS transistor), and each of the first and second pull-down transistors PD1 and PD2 and the first and second path gate transistors PG1 and PG2 may be a second conductivity type transistor (e.g., an NMOS transistor).

Figure 2:
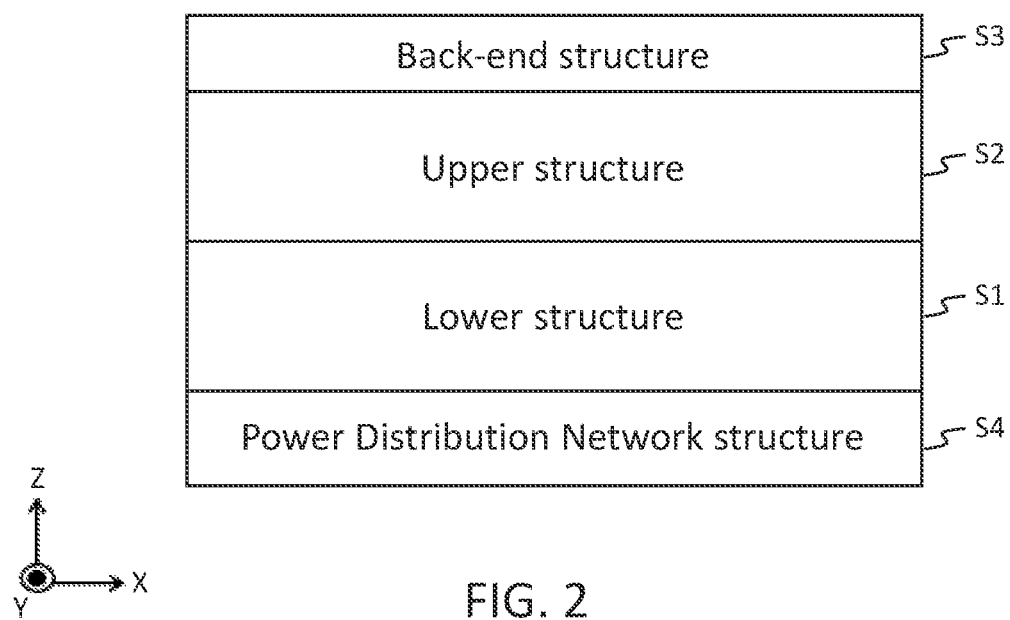
FIG. 2 is a schematic diagram of an SRAM according to some embodiments.

FIG. 2 is a schematic diagram of an SRAM according to some embodiments. Referring to FIG. 2, an SRAM may be formed to include multiple stacked structures. The SRAM may include a lower structure S1, an upper structure S2 and a back-end structure S3, which are stacked in a vertical direction Z. A PDN structure S4 may be provided below the lower structure S1. The lower structure S1 may include a substrate (e.g., a substrate 100 in FIG. 4A) and lower transistors (e.g., e.g., a first pull-down transistor PD1 and a second pull-down transistor PD2 in FIG. 3B). The upper structure S2 may include upper transistors (e.g., a first pull-up transistor PU1 and a second pull-up transistor PU2 in FIG. 3A) and interconnectors (e.g., a source/drain connector SDC in FIG. 4A). The back-end structure S3 may include metal wires (e.g., a first wordline WL1 and a first bit-line BL1 in FIG. 4A). The PDN structure S4 may include power rails (e.g., a first power rail PR1 and a second power rail PR2 in FIG. 4A).

According to some embodiments, two transistors of a single inverter may be provided in the lower transistor structure and the upper transistor structure, respectively. For example, the first pull-up transistors PU1 of the right-side inverter INV_R may be provided in the upper transistor structure, and the first pull-down transistors PD1 of the right-side inverter INV_R may be provided in the lower transistor structure. In some embodiments, the first pull-up transistor PU1 may overlap the first pull-down transistor PD1. For example, a source/drain of the first pull-up transistor PU1 may overlap a source/drain of the first pull-down transistor PD1.

Figure 3A:
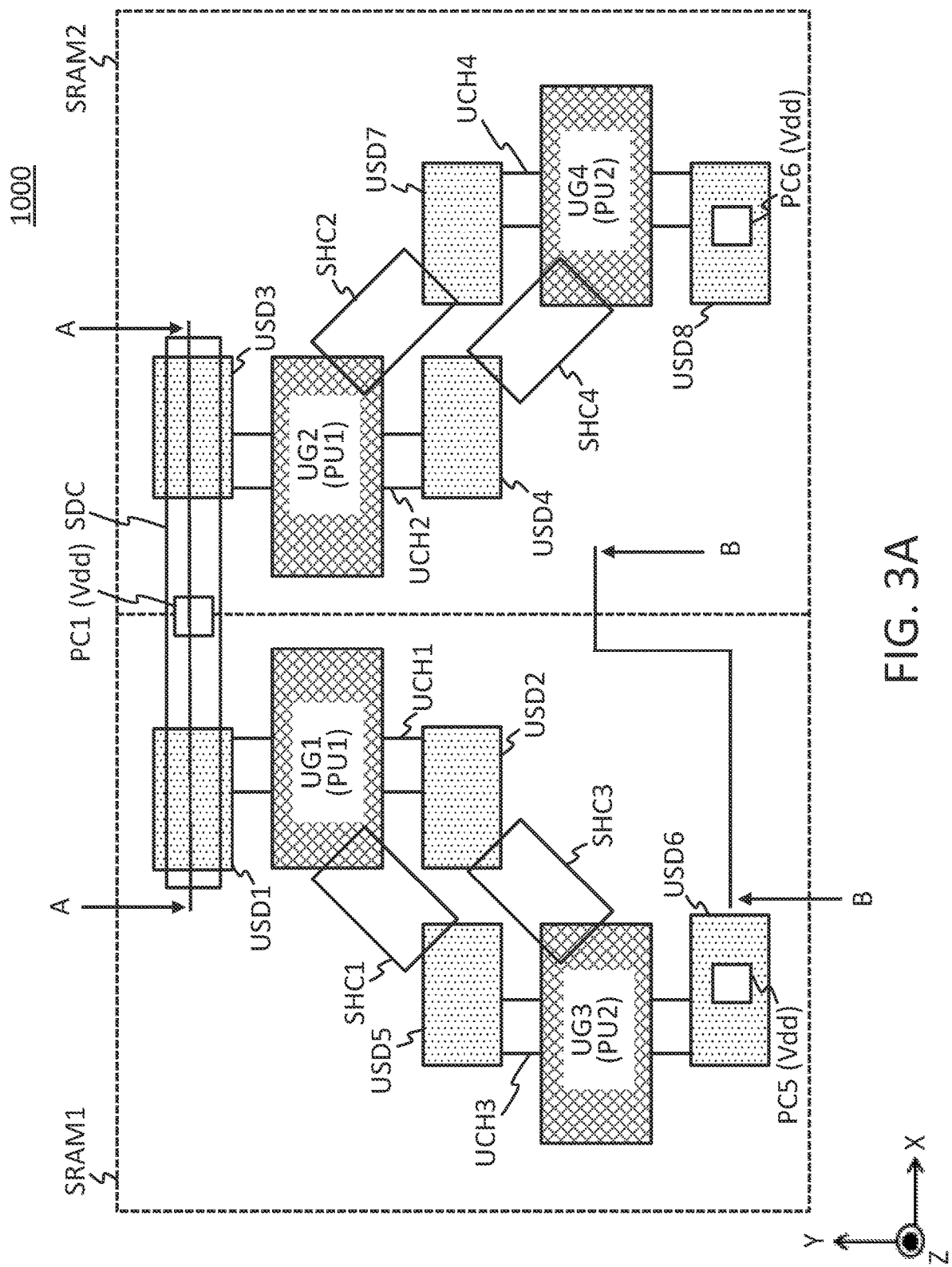
FIGS. 3A, 3B, 3C and 3D are layouts of stacked structures of a first integrated circuit device according to some embodiments.
Figure 3B:
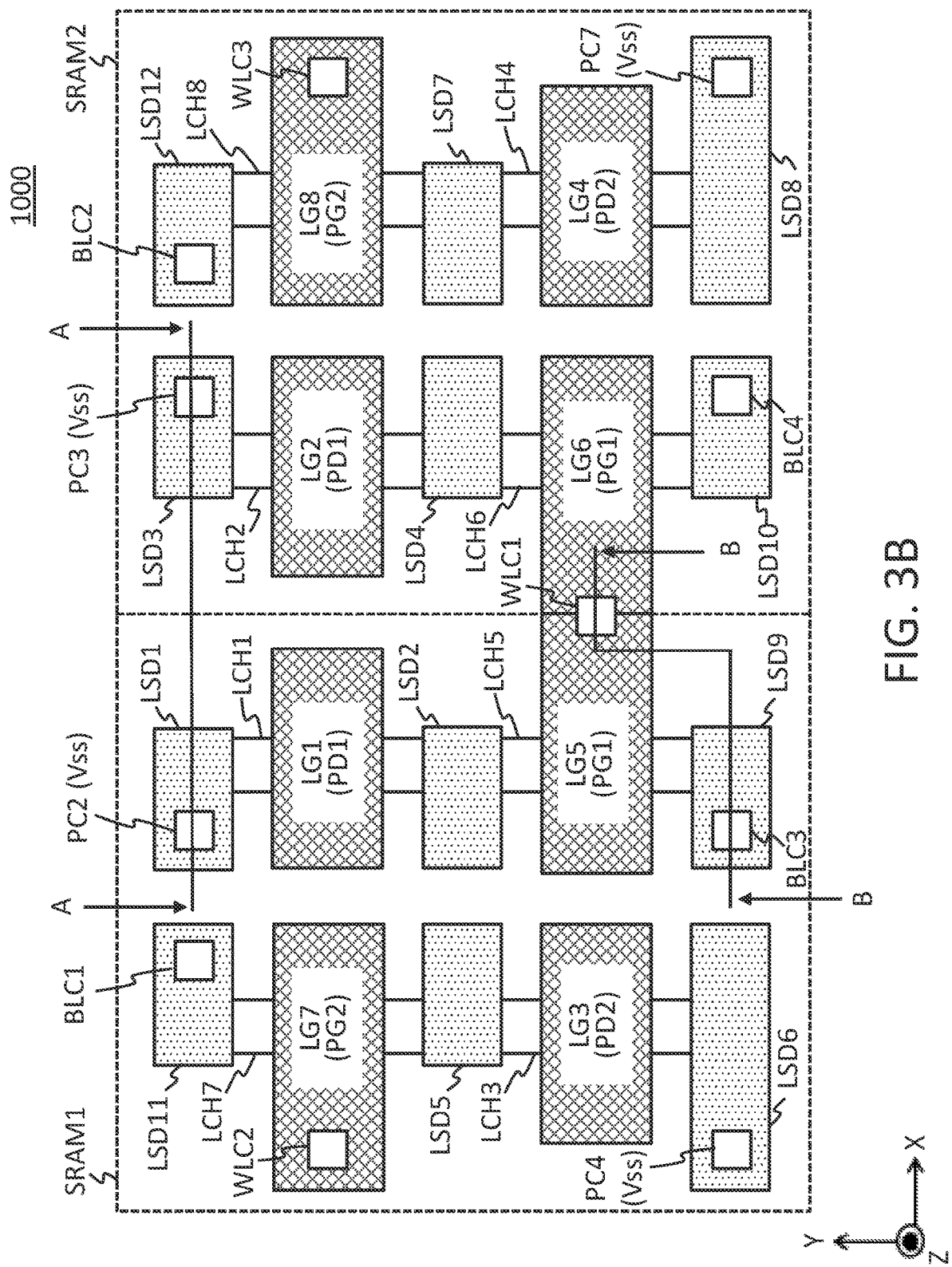
Figure 3C:
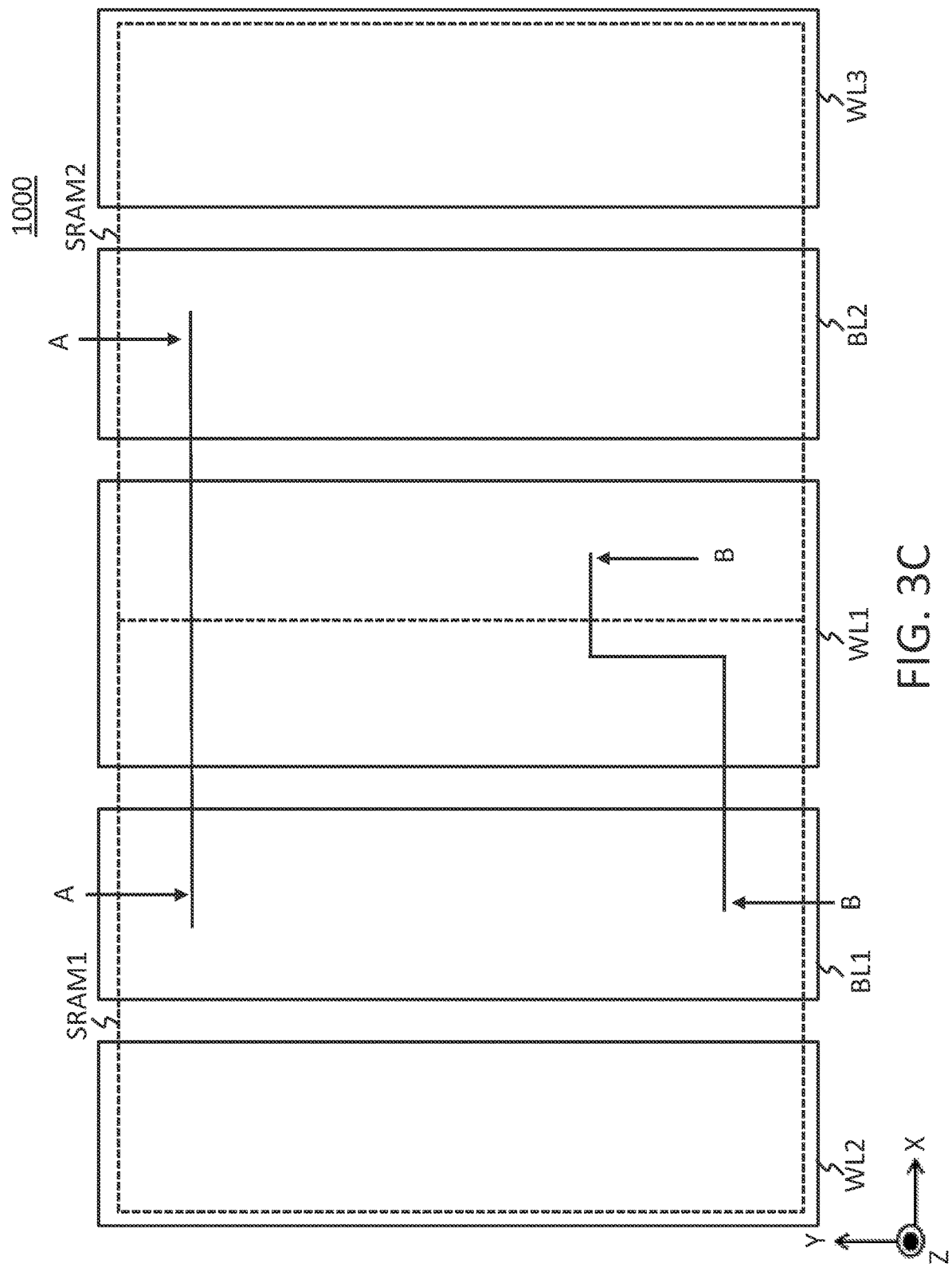
Figure 3D:
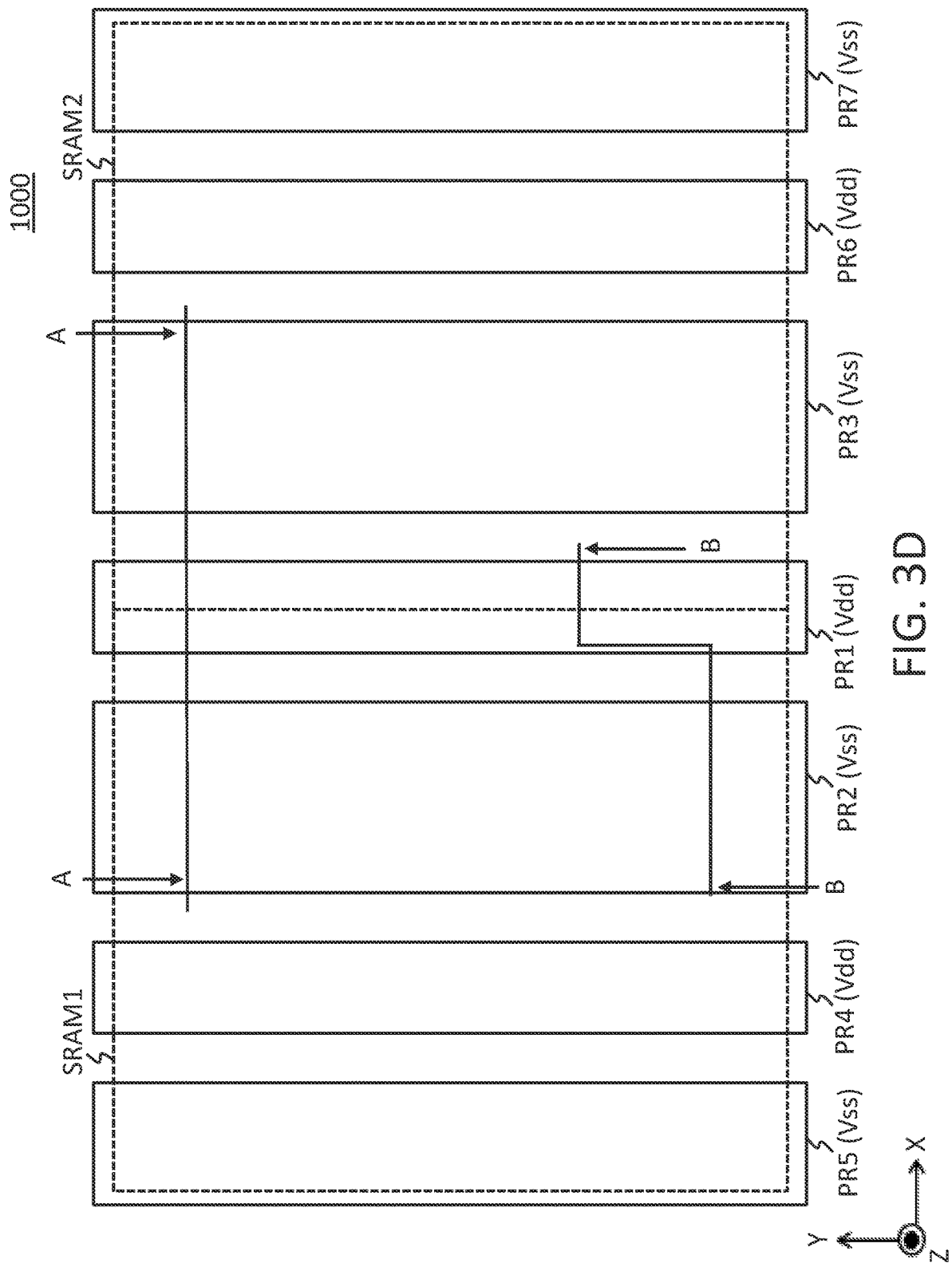
Figure 4A:
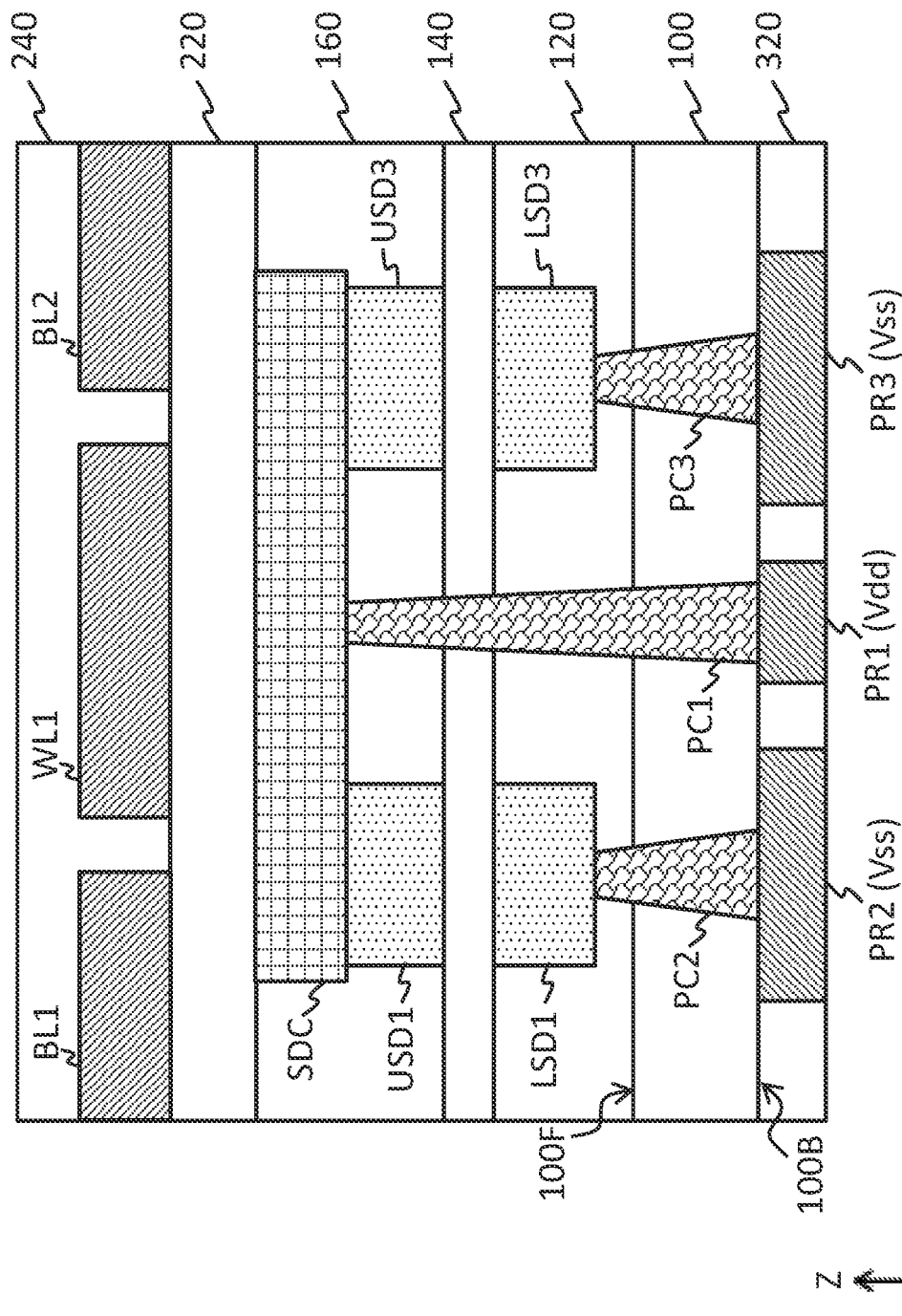
FIGS. 4A and 4B are cross-sectional views of the first integrated circuit device taken along a line A-A and a line B-B in FIGS. 3A to 3D according to some embodiments.
Figure 4B:
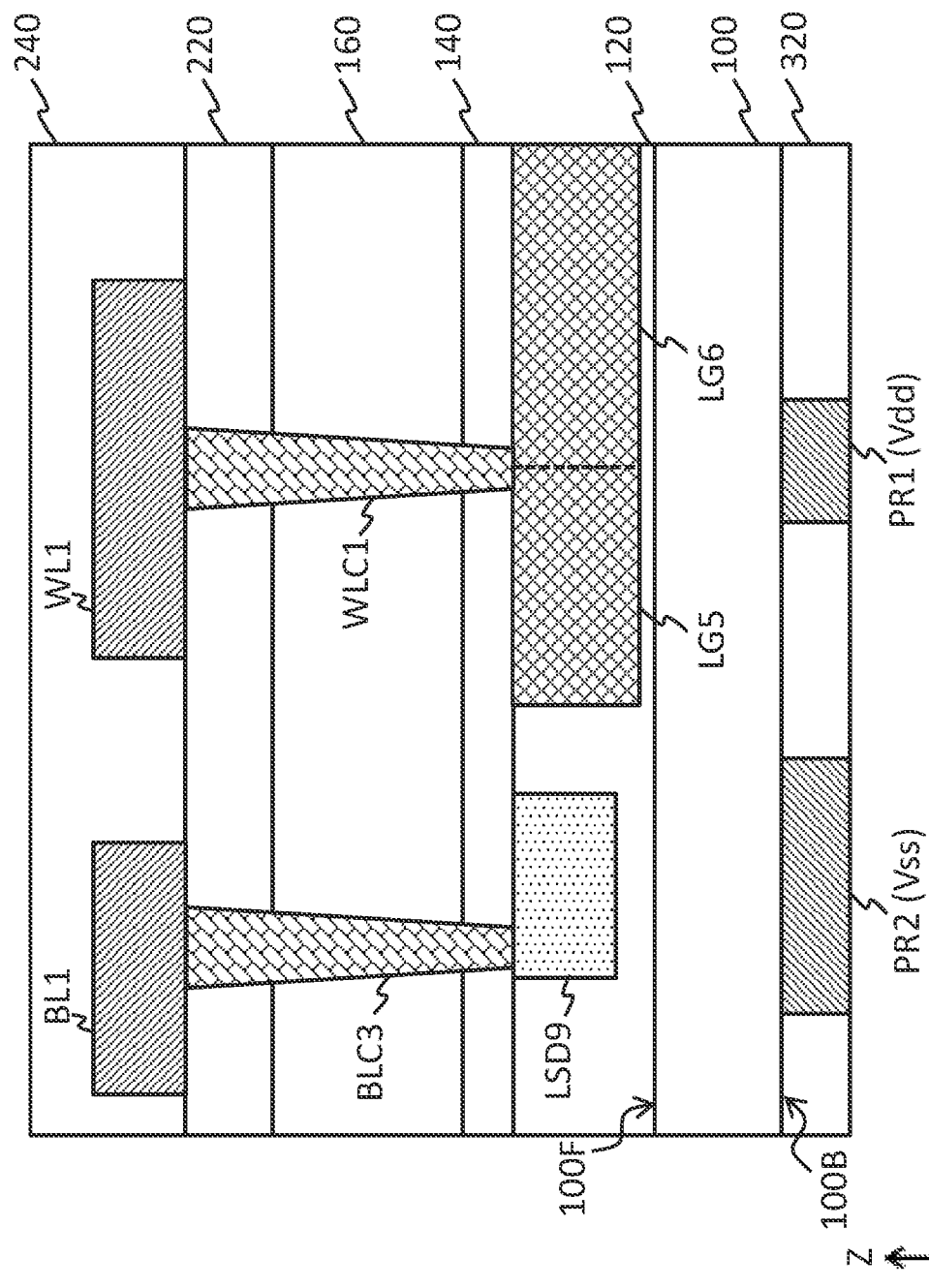

FIGS. 3A, 3B, 3C and 3D are layouts of stacked structures of a first integrated circuit device 1000 according to some embodiments, and FIGS. 4A and 4B are cross-sectional views of the first integrated circuit device 1000 taken along a line A-A and a line B-B in FIGS. 3A to 3D according to some embodiments. FIG. 3A is a layout of an upper structure, FIG. 3B is a layout of a lower structure, FIG. 3C is a layout of a back-end structure, and FIG. 3D is a layout of a PDN structure.

Referring to FIGS. 3A to 3D, the first integrated circuit device 1000 may include a first SRAM unit SRAM1 and a second SRAM unit SRAM2. The first SRAM unit SRAM1 and the second SRAM unit SRAM2 may be arranged in a first horizontal direction X. The dotted lines in FIGS. 3A to 3D represent unit boundaries. In some embodiments, the first SRAM unit SRAM1 and the second SRAM unit SRAM2 may have layouts symmetric with respect to the unit boundary therebetween as illustrated in FIGS. 3A to 3D. Those symmetrical layouts allow the first and second SRAM units SRAM1 and SRAM2 to have a contact (e.g., a first power contact PC1 or a first wordline contact WLC1) shared by those two units such that an area of an individual SRAM unit can be reduced.

Referring to FIG. 3A, the upper structure may include first and second pull-up transistors PU1 and PU2 of each SRAM unit. A first upper transistor including a first upper gate electrode UG1 may be the first pull-up transistor PU1 of the first SRAM unit SRAM1, and a second upper transistor including a second upper gate electrode UG2 may be the first pull-up transistor PU1 of the second SRAM unit SRAM2. The first upper transistor may also include a first upper channel region UCH1 and first and second upper source/drain regions USD1 and USD2 contacting the first upper channel region UCH1. The second upper transistor may also include a second upper channel region UCH2 and third and fourth upper source/drain regions USD3 and USD4 contacting the second upper channel region UCH2.

A third upper transistor including a third upper gate electrode UG3 may be the second pull-up transistor PU2 of the first SRAM unit SRAM1, and a fourth upper transistor including a fourth upper gate electrode UG4 may be the second pull-up transistor PU2 of the second SRAM unit SRAM2. The third upper transistor may also include a third upper channel region UCH3 and fifth and sixth upper source/drain regions USD5 and USD6 contacting the third upper channel region UCH3. The fourth upper transistor may also include a fourth upper channel region UCH4 and seventh and eighth upper source/drain regions USD7 and USD8 contacting the fourth upper channel region UCH4. In some embodiments, the first, second, third and fourth upper transistors may have the same conductivity type (e.g., p-type).

Referring to FIG. 3B, the lower structure may include first and second pull-down transistors PD1 and PD2 and first and second gate path transistors PG1 and PG2 of each SRAM unit. A first lower transistor including a first lower gate electrode LG1 may be the first pull-down transistor PD1 of the first SRAM unit SRAM1, and a second lower transistor including a second lower gate electrode LG2 may be the first pull-down transistor PD1 of the second SRAM unit SRAM2. The first lower transistor may also include a first lower channel region LCH1 and first and second lower source/drain regions LSD1 and LSD2 contacting the first lower channel region LCH1. The second lower transistor may also include a second lower channel region LCH2 and third and fourth lower source/drain regions LSD3 and LSD4 contacting the second lower channel region LCH2.

The second lower source/drain region LSD2 may be electrically connected to the second upper source/drain region USD2 through a conductive contact that may contact both the second lower source/drain region LSD2 and the second upper source/drain region USD2. The fourth lower source/drain region LSD4 may be electrically connected to the fourth upper source/drain region USD4 through a conductive contact that may contact both the fourth lower source/drain region LSD4 and the fourth upper source/drain region USD4. In some embodiments, the second upper source/drain region USD2 may overlap the second lower source/drain region LSD2, and the fourth upper source/drain region USD4 may overlap the fourth lower source/drain region LSD4.

A third lower transistor including a third lower gate electrode LG3 may be the second pull-down transistor PD2 of the first SRAM unit SRAM1, and a fourth lower transistor including a fourth lower gate electrode LG4 may be the second pull-down transistor PD2 of the second SRAM unit SRAM2. The third lower transistor may also include a third lower channel region LCH3 and fifth and sixth lower source/drain regions LSD5 and LSD6 contacting the third lower channel region LCH3. The fourth lower transistor may also include a fourth lower channel region LCH4 and seventh and eighth lower source/drain regions LSD7 and LSD8 contacting the fourth lower channel region LCH4.

The fifth lower source/drain region LSD5 may be electrically connected to the fifth upper source/drain region USD5 through a conductive contact that may contact both the fifth lower source/drain region LSD5 and the fifth upper source/drain region USD5. The seventh lower source/drain region LSD7 may be electrically connected to the seventh upper source/drain region USD7 through a conductive contact that may contact both the seventh lower source/drain region LSD7 and the fourth upper source/drain region USD7. In some embodiments, the fifth upper source/drain region USD5 may overlap the fifth lower source/drain region LSD5, and the seventh upper source/drain region USD7 may overlap the seventh lower source/drain region LSD7.

A fifth lower transistor including a fifth lower gate electrode LG5 may be the first path gate transistor PG1 of the first SRAM unit SRAM1, and a sixth lower transistor including a sixth lower gate electrode LG6 may be the first path gate transistor PG1 of the second SRAM unit SRAM2. The fifth lower transistor may also include a fifth lower channel region LCH5 and a ninth lower source/drain region LSD9 contacting the fifth lower channel region LCH5. In some embodiments, the second lower source/drain region LSD2 of the first lower transistor may be shared with the fifth lower transistor, and the fifth lower channel region LCH5 may contact the second lower source/drain region LSD2 of the first lower transistor. The sixth lower transistor may also include a sixth lower channel region LCH6 and a tenth lower source/drain region LSD10 contacting the sixth lower channel region LCH6. In some embodiments, the fourth lower source/drain region LSD4 of the second lower transistor may be shared with the sixth lower transistor, and the sixth lower channel region LCH6 may contact the fourth lower source/drain region LSD4 of the second lower transistor.

A seventh lower transistor including a seventh lower gate electrode LG7 may be the second path gate transistor PG2 of the first SRAM unit SRAM1, and an eighth lower transistor including an eighth lower gate electrode LG8 may be the second path gate transistor PG2 of the second SRAM unit SRAM2. The seventh lower transistor may also include a seventh lower channel region LCH7 and an eleventh lower source/drain region LSD11 contacting the seventh lower channel region LCH7. In some embodiments, the fifth lower source/drain region LSD5 of the third lower transistor may be shared with the seventh lower transistor, and the seventh lower channel region LCH7 may contact the fifth lower source/drain region LSD5 of the third lower transistor. The eighth lower transistor may also include an eighth lower channel region LCH8 and a twelfth lower source/drain region LSD12 contacting the eighth lower channel region LCH8. In some embodiments, the seventh lower source/drain region LSD7 of the fourth lower transistor may be shared with the eighth lower transistor, and the eighth lower channel region LCH8 may contact the seventh lower source/drain region LSD7 of the fourth lower transistor.

The first upper transistor and the first lower transistor constitute a first inverter of the first SRAM unit SRAM1, the second upper transistor and the second lower transistor constitute a second inverter of the second SRAM unit SRAM2, the third upper transistor and the third lower transistor constitute a third inverter of the first SRAM unit SRAM1, and the fourth upper transistor and the fourth lower transistor constitute a fourth inverter of the second SRAM unit SRAM2.

Referring to FIG. 3C, the back-end structure may include wordlines (e.g., first, second and third wordlines WL1, WL2, WL3) and bit-lines (e.g., first and second bit-lines BL1 and BL2), which are alternately arranged along the first horizontal direction X. In some embodiments, each of the wordlines and the bit-lines may have a linear shape extending longitudinally in a second horizontal direction Y that is perpendicular to the first horizontal direction X, as illustrated in FIG. 3C.

Referring to FIG. 3D, the PDN structure may include power rails (e.g., first, second, third, fourth, fifth, sixth and seventh power rails PR1, PR2, PR3, PR4, PR5, PR6 and PR7). In some embodiments, two adjacent power rails (e.g., the first and second power rails PR1 and PR2 or the fourth and fifth power rails PR4 and PR5) may be electrically connected to different power sources having different voltages. The first, fourth and sixth power rails PR1, PR4 and PR6 may be electrically connected to a first power having a first voltage (e.g., a drain voltage Vdd), and the second, third, fifth and seventh power rails PR2, PR3, PR5 and PR7 may be electrically connected to a second power having a second voltage (e.g., a source voltage Vss). In some embodiments, each of the power rails may have a linear shape extending longitudinally in the second horizontal direction Y, as illustrated in FIG. 3D.

Referring to FIGS. 3A to 3D and 4A, the lower structure may include a substrate 100 on which upper and lower transistors are provided. The substrate 100 may include a front side 100F facing those transistors and a back side 100B opposite the front side 100F. The first horizontal direction X and the second horizontal direction Y may be parallel to the front side 100F and/or the back side 100B of the substrate 100. The first integrated circuit device 1000 may further include multiple insulating layers (e.g., a first insulating layer 120, a second insulating layer 140, a third insulating layer 160, a fourth insulating layer 220, a fifth insulating layer 240 and a sixth insulating layer 320). In some embodiments, some of those insulating layers may include the same material. The second insulating layer 140 may separate the first upper source/drain region USD1 from the first lower source/drain region LSD1 and may separate the third upper source/drain region USD3 from the third lower source/drain region LSD3.

The substrate 100 may include one or more semiconductor materials, for example, Si, Ge, SiGe, GaP, GaAs, SiC, SiGeC and/or InP. For example, the substrate 100 may be a silicon layer. In some embodiments, the substrate 100 may be a portion of a wafer (e.g., a single crystal silicon wafer). Each of the first to sixth insulating layers 120, 140, 160, 220, 240 and 320 may include an insulating material (e.g., silicon oxide, silicon nitride, silicon oxynitride or low-k material). The low k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

Each of the gate electrodes may include a semiconductor layer (e.g., a poly silicon layer), a work function layer (e.g., TiC layer, TiAl layer, TiAlC layer or TiN layer) and/or a metal layer (e.g., a tungsten layer, an aluminum layer or a copper layer). Each of the source/drain regions may be formed through an epitaxial growth process using a channel region to which that source/drain region contacts. Each of the source/drain regions may include one or more semiconductor materials, for example, Si, Ge, SiGe, GaP, GaAs, SiC, SiGeC and/or InP and may optionally include impurities (e.g., boron, phosphorus or arsenic).

The upper structure may also include a source/drain connector SDC provided on the first upper source/drain region USD1 and the third upper source/drain region USD3. The source/drain connector SDC may extend longitudinally in the first horizontal direction X and may electrically connect the first upper source/drain region USD1 and the third upper source/drain region USD3. In some embodiments, the source/drain connector SDC may contact upper surfaces of the first upper source/drain region USD1 and the third upper source/drain region USD3.

The first integrated circuit device 1000 may further include first, second, third, fourth, fifth, sixth and seventh power contacts PC1, PC2, PC3, PC4, PC5, PC6 and PC7. Each of those power contacts may electrically connect one of the power rails to one of the source/drain regions. Each of those power contacts may extend through the substrate 100.

The first power contact PC1 may be provided on the unit boundary of the first and second SRAM units SRAM1 and SRAM2, as illustrated in FIG. 3A and may electrically connect the source/drain connector SDC to the first power rail PR1. The first power contact PC1 may extend through the substrate 100 and may be in the first, second and third insulating layers 120, 140 and 160. In some embodiments, the first power contact PC1 may contact both the source/drain connector SDC and the first power rail PR1.

The second power contact PC2 may electrically connect the first lower source/drain region LSD1 to the second power rail PR2, and the third power contact PC3 may electrically connect the third lower source/drain region LSD3 to the third power rail PR3. In some embodiments, the second power contact PC2 may contact both the first lower source/drain region LSD1 and the second power rail PR2, and the third power contact PC3 may contact both the third lower source/drain region LSD3 and the third power rail PR3. Each of the second power contact PC2 and the third power contact PC3 may extend through the substrate 100.

In some embodiments, each of the first, second and third power contacts PC1, PC2 and PC3 may have a wider width in the first horizontal direction X adjacent the back side 100B of the substrate 100, and the width of each of the first, second and third power contacts PC1, PC2 and PC3 may decrease along the vertical direction Z from the back side 100B to the front side 100F of the substrate 100. The vertical direction Z may be perpendicular to the first and second horizontal directions X and Y.

Although FIG. 4A illustrates that the first, second and third power contacts PC1, PC2 and PC3 contact the first, second and third power rails PR1, PR2 and PR3, respectively, in some embodiments, a connection structure including insulating layers, conductive vias and conductive wires may be provided between the first, second and third power contacts PC1, PC2 and PC3 and the first, second and third power rails PR1, PR2 and PR3, and the first, second and third power contacts PC1, PC2 and PC3 may be electrically connected to the first, second and third power rails PR1, PR2 and PR3 through the connection structure. For example, the first power contact PC1 may be electrically connected to the first power rail PR1 through at least one conductive wire and at least one via of the connection structure provided between the first power contact PC1 and the first power rail PR1.

Referring to FIGS. 4A and 4B, the first wordline WL1 and the first and second bit-lines BL1 and BL2 may be provided in the fifth insulating layer 240. The first wordline WL1, the first and second bit-lines BL1 and BL2 and the fifth insulating layer 240 constitute the back-end structure. The substrate 100 may extend between the PDN structure including the first and second power rails PR1 and PR2 and the first wordline WL1 and may also extend between the PDN structure and the first and second bit-lines BL1 and BL2.

In some embodiments, lower surfaces of the first wordline WL1 and the first bit-line BL1 may be at an equal height from the substrate 100. In some embodiments, the second and third wordlines WL2 and WL3 and the second bit-line BL2 may also be provided in the fifth insulating layer 240 and lower surfaces of the second and third wordlines WL2 and WL3 and the second bit-line BL2 may be at an equal height from the substrate 100. In some embodiments, the first wordline WL1 may overlap at least one power rail (i.e., the first power rail PR1).

The first integrated circuit device 1000 may further include wordline contacts (e.g., first, second and third wordline contacts WLC1, WLC2 and WLC3) and bit-line contacts (e.g., first, second, third and fourth bit-line contacts BLC1, BLC2, BLC3 and BLC4). Each wordline contact may electrically connect one of the gate electrodes to one of the wordlines, and each bit-line contact may electrically connect one of the source/drain regions to one of the bit-lines. For example, the first wordline contact WLC1 may electrically connect the fifth lower gate electrode LG5 to the first wordline WL1, and the third bit-line contact BLC3 may electrically connect the ninth lower source/drain region LSD9 to the first bit-line BL1. In some embodiments, the first wordline contact WLC1 may contact both the fifth lower gate electrode LG5 and the first wordline WL1, and the first bit-line contact BLC1 may contact both the ninth lower source/drain region LSD9 and the first bit-line BL1.

In some embodiments, the first wordline contact WLC1 may be provided on the unit boundary between the first SRAM unit SRAM1 and the second SRAM unit SRAM2, as illustrated in FIG. 3B, and may be electrically connected to both the fifth lower gate electrode LG5 of the first SRAM unit SRAM1 and the sixth lower gate electrode LG6 of the second SRAM unit SRAM2.

Referring again FIGS. 3A and 4A, the first integrated circuit device 1000 may further include a first shared contact SHC1 electrically connecting the first upper gate electrode UG1 to the fifth upper source/drain region USD5. The first shared contact SHC1 may be formed in the third insulating layer 160 and may be formed on the first upper gate electrode UG1 and the fifth upper source/drain region USD5. In some embodiments, the first shared contact SHC1 may contact upper surfaces of the first upper gate electrode UG1 and the fifth upper source/drain region USD5.

Additionally, the first integrated circuit device 1000 may include a second shared contact SHC2, a third shared contact SHC3, and a fourth shared contact SHC4. The second shared contact SHC2 may electrically connect the second upper gate electrode UG2 to the seventh upper source/drain region USD7, the third shared contact SHC3 may electrically connect the third upper gate electrode UG3 to the second upper source/drain region USD2, and the fourth shared contact SHC4 may electrically connect the fourth upper gate electrode UG4 to the fourth upper source/drain region USD4. In some embodiments, the second shared contact SHC2, the third shared contact SHC3, and the fourth shared contact SHC4 may be formed in the third insulating layer 160.

The source/drain connector SDC, the wordlines (e.g., the first wordline WL1), the bit-lines (e.g., the first bit-line BL1), the power rails (e.g., the first power rail PR1), the wordline contacts (e.g., the first wordline contact WLC1), the bit-line contacts (e.g., the first bit-line contact BLC1), the power contacts (e.g., the first power contact PC1), and the shared contacts (e.g., the first shared contact SHC1) may include a metal (e.g., tungsten, cobalt, aluminum, ruthenium or copper) and/or a metal nitride layer (e.g., titanium nitride or tantalum nitride).

Figure 5:
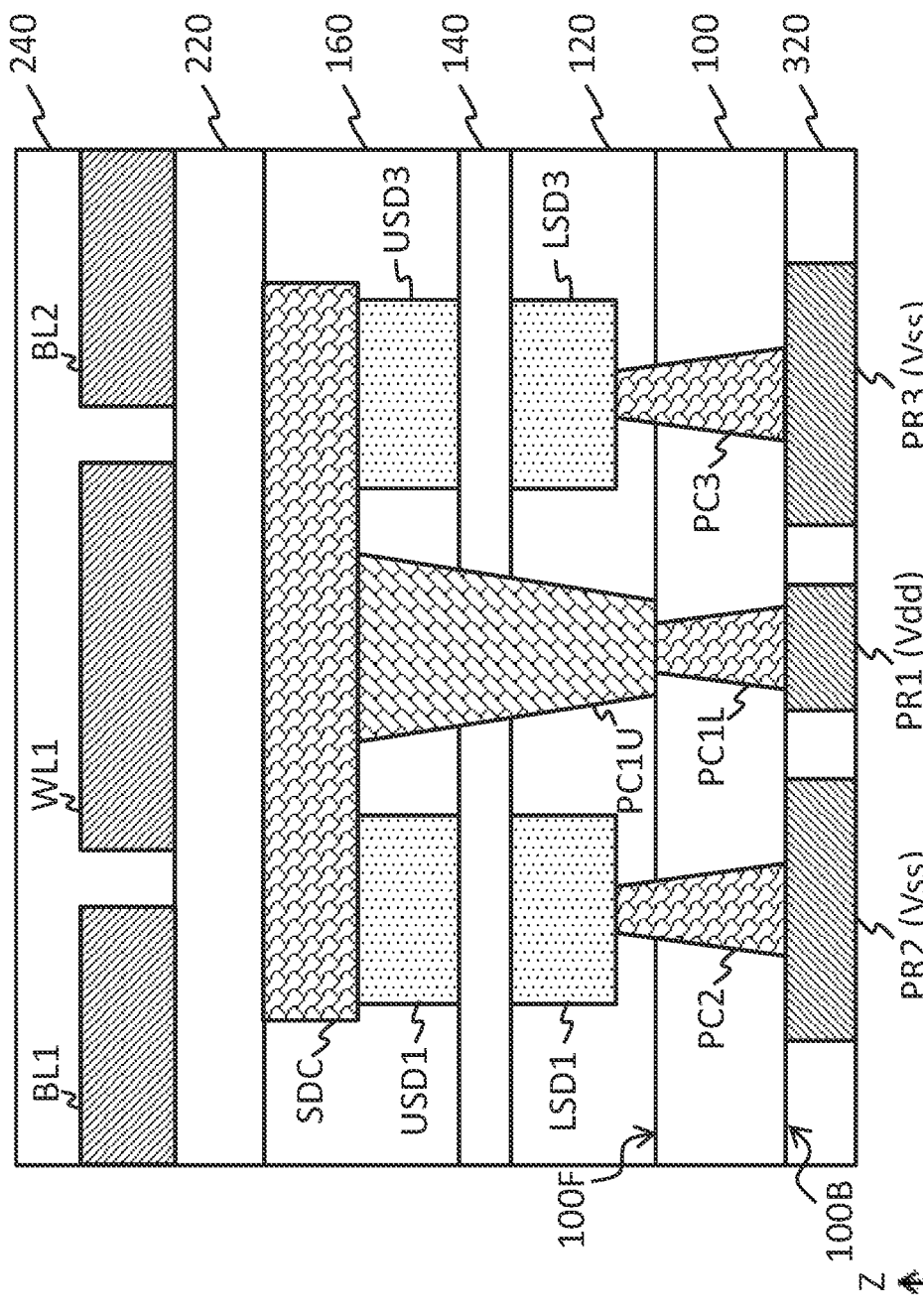
FIG. 5 is a cross-sectional view of the first integrated circuit device taken along the line A-A in FIGS. 3A to 3D according to some embodiments.

FIG. 5 is a cross-sectional view of the first integrated circuit device 1000 taken along the line A-A of FIGS. 3A to 3D according to some embodiments. The cross-sectional view of FIG. 5 is similar to that of FIG. 4A with a primary difference being that the first power contact PC1 includes an upper portion PC1U and a lower portion PC1L. The lower portion PC1L may be in the substrate 100 and may have a wider width in the first horizontal direction X adjacent the back side 100B of the substrate 100, and the width of the lower portion PC1L may decrease along the vertical direction Z from the back side 100B to the front side 100F of the substrate 100. The upper portion PC1U may be in the first, second and third insulating layers 120, 140 and 160. The upper portion PC1U may have a width in the first horizontal direction X, which is narrow adjacent the front side 100F of the substrate 100 and increases along the vertical direction Z from the front side 100F of the substrate 100 toward the shared source/drain connector SDC.

Figure 6A:
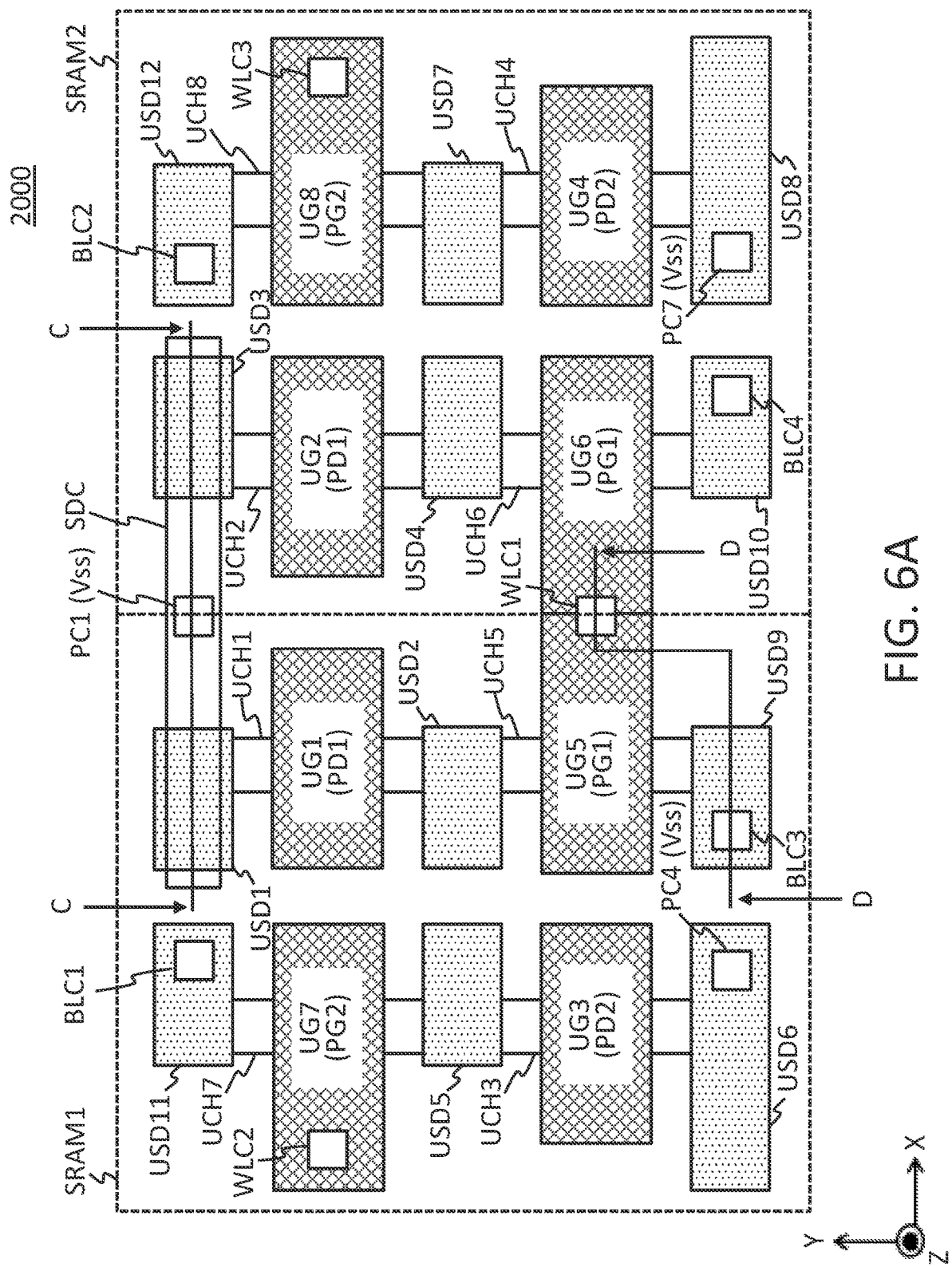
FIGS. 6A, 6B, 6C and 6D are layouts of stacked structures of a second integrated circuit device according to some embodiments.
Figure 6B:
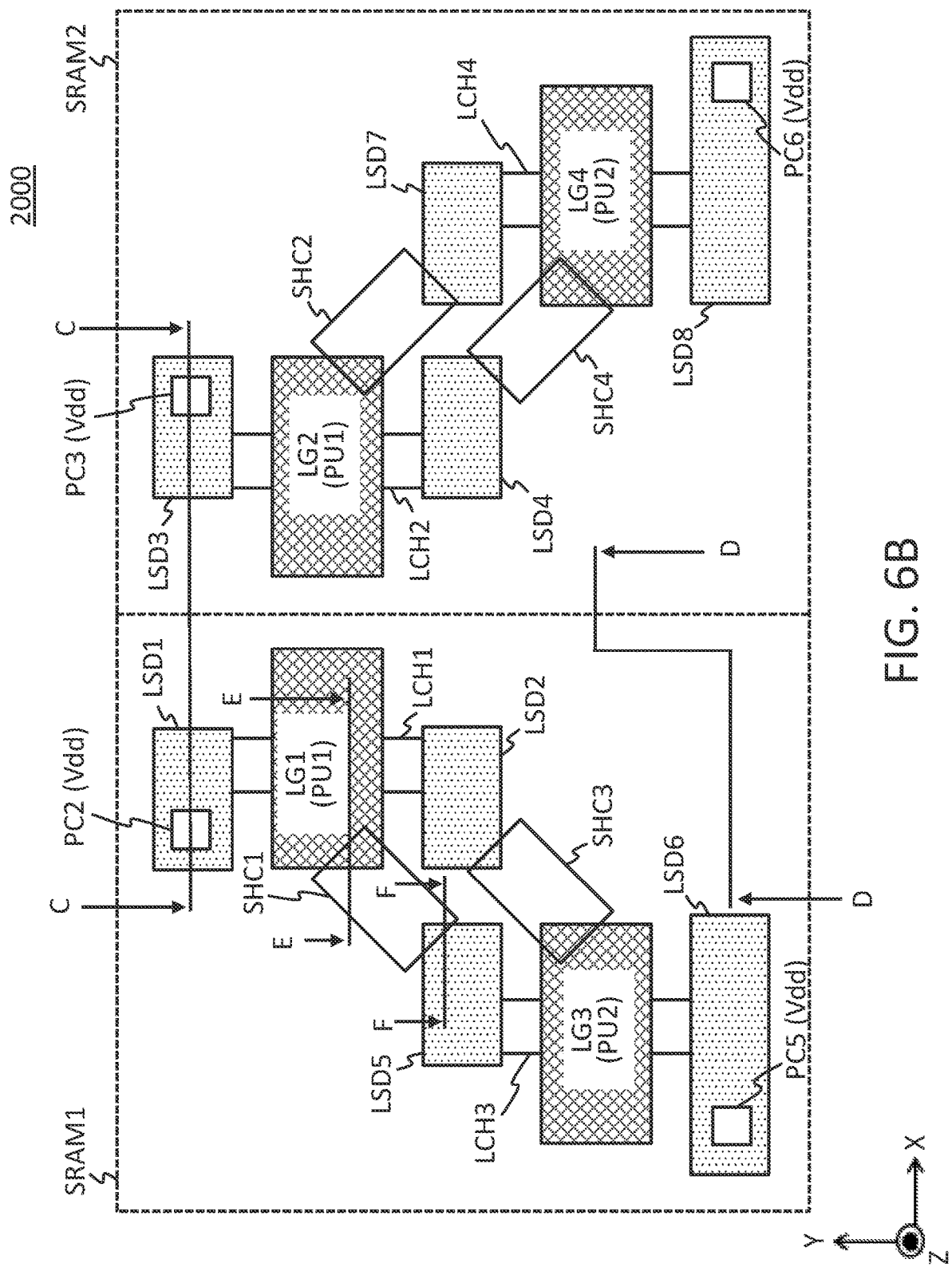
Figure 6C:
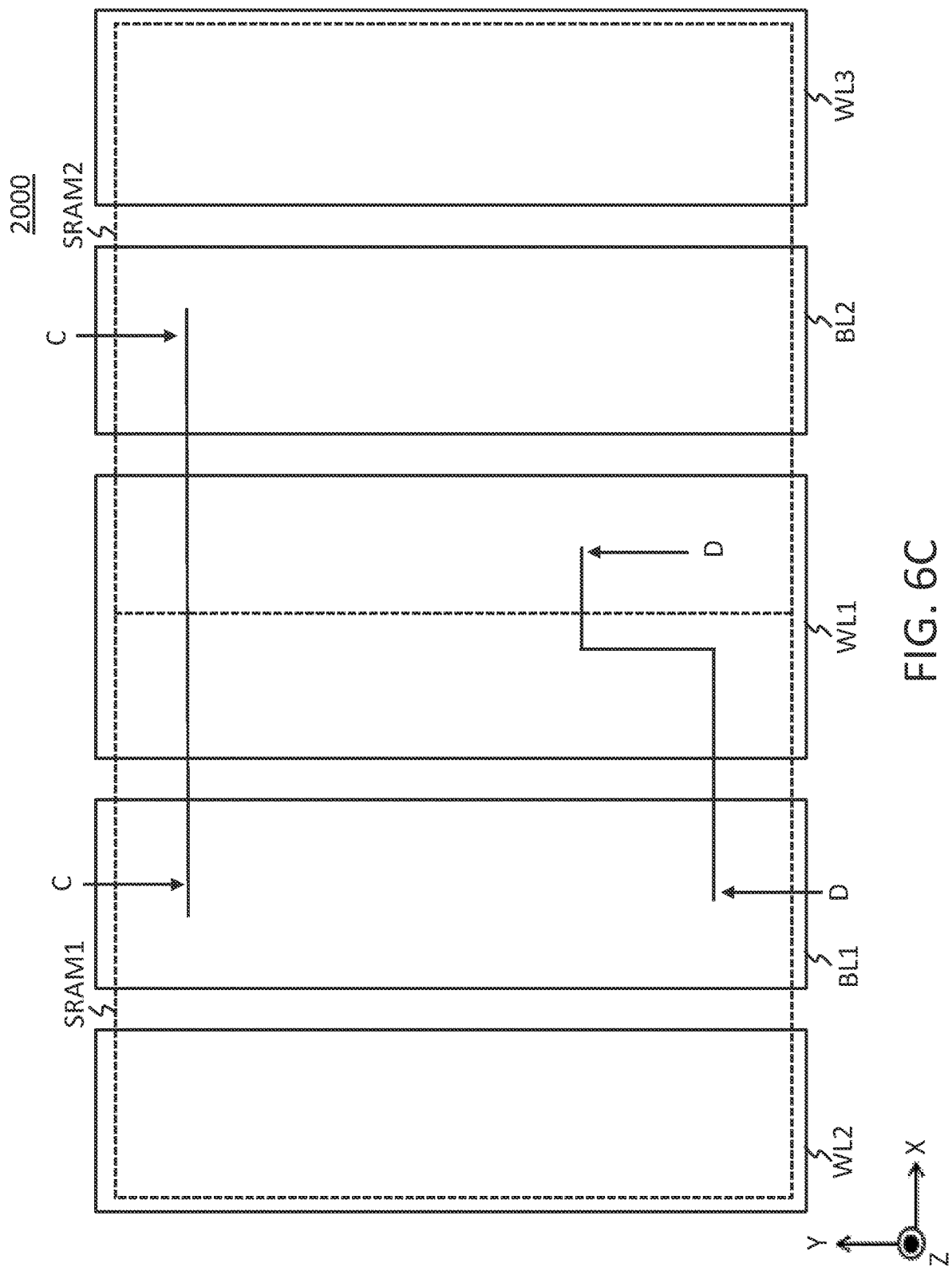
Figure 6D:
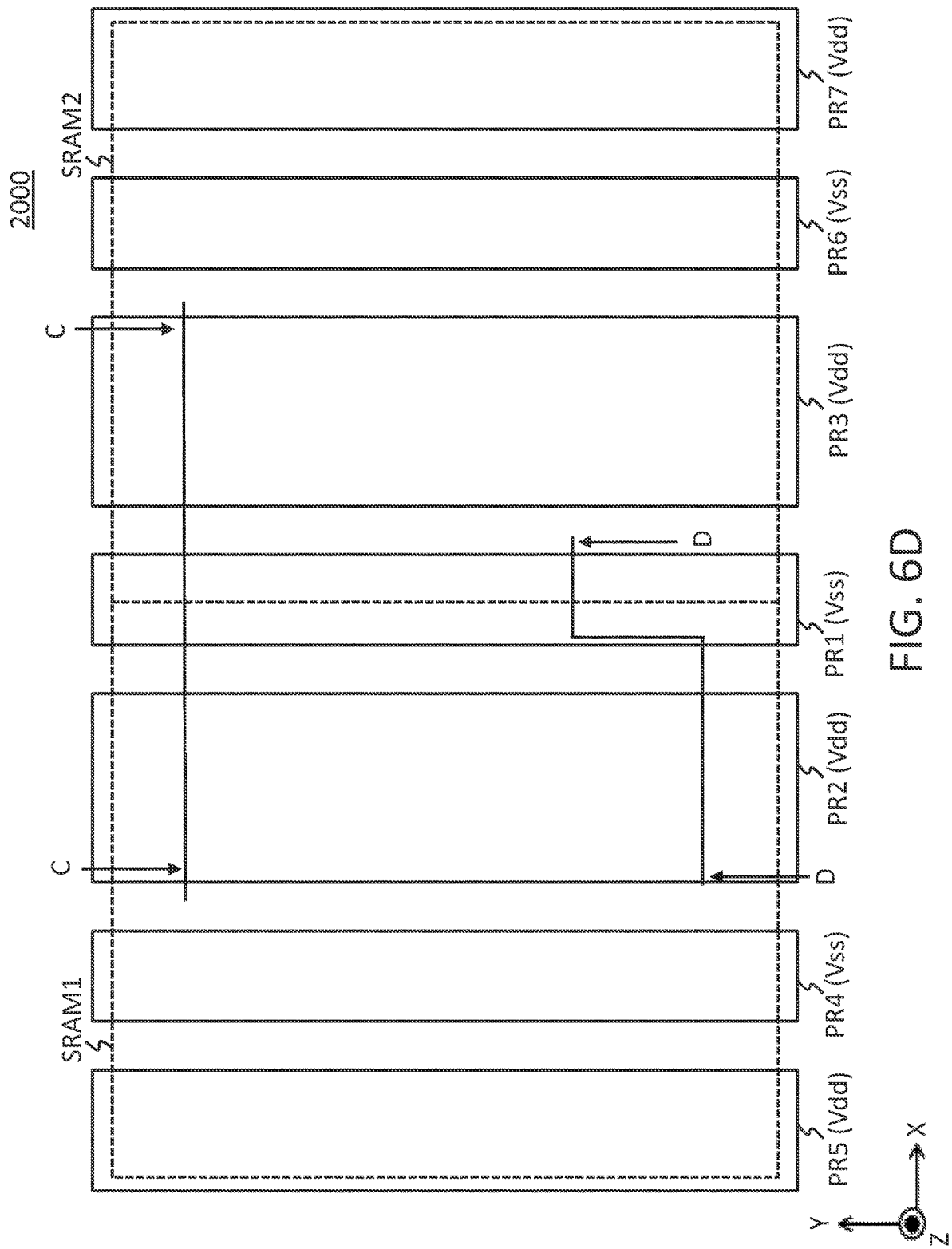
Figure 7A:
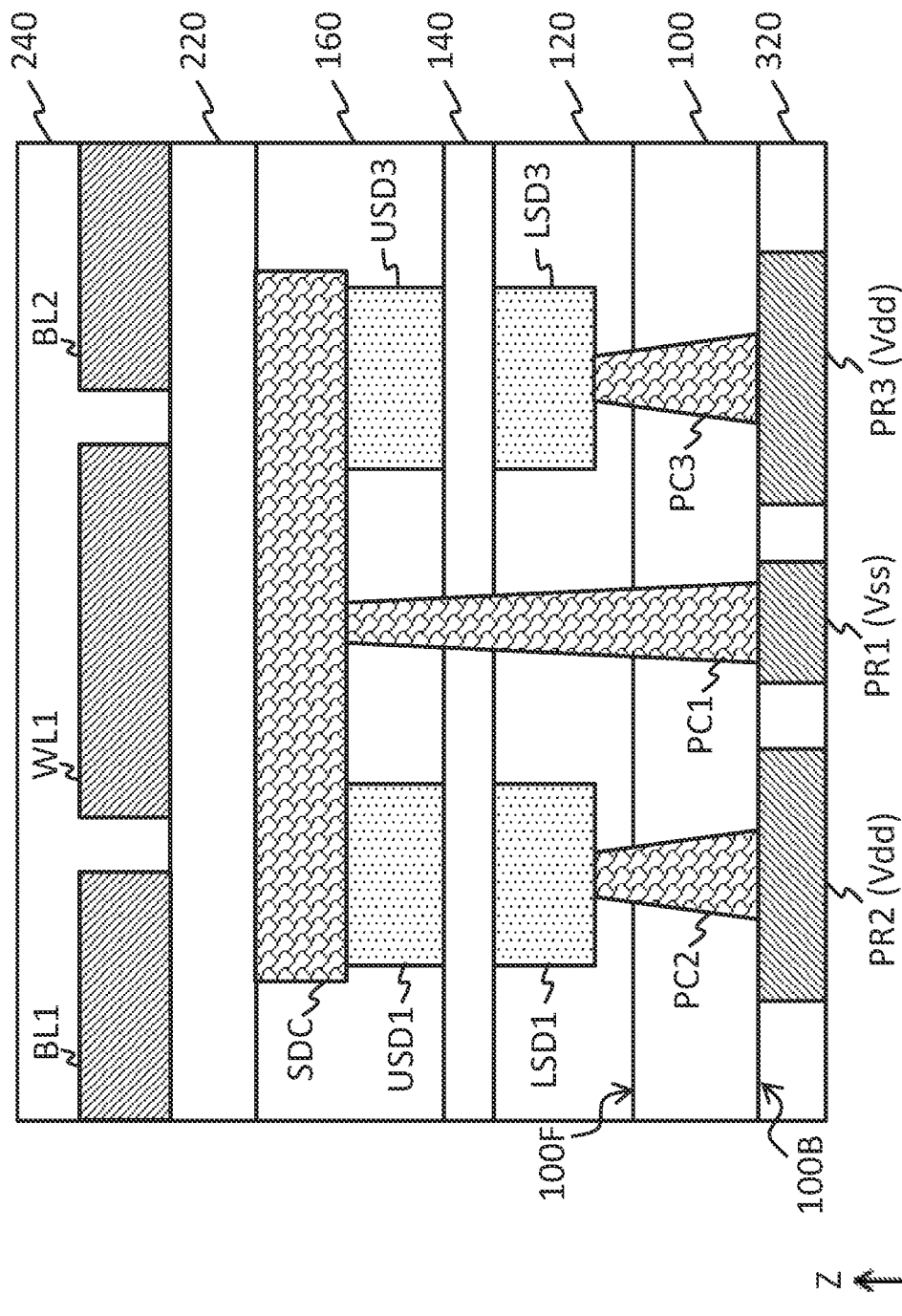
FIGS. 7A and 7B are cross-sectional views of the second integrated circuit device taken along a line C-C and a line D-D in FIGS. 6A to 6D according to some embodiments.
Figure 7B:
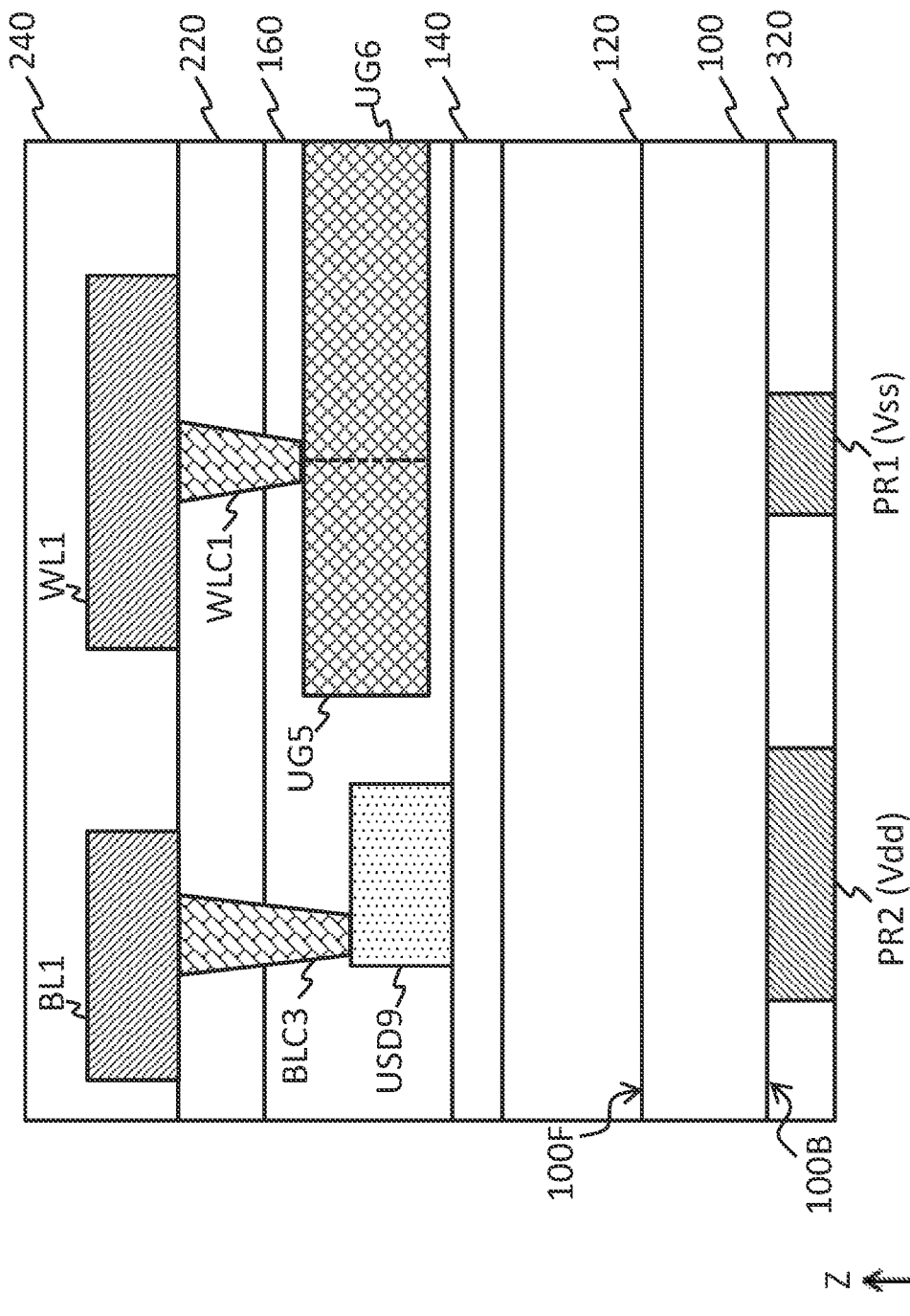

FIGS. 6A, 6B, 6C and 6D are layouts of stacked structures of a second integrated circuit device 2000 according to some embodiments, and FIGS. 7A and 7B are cross-sectional views of the integrated circuit device 2000 taken along a line C-C and a line D-D in FIGS. 6A to 6D according to some embodiments. FIG. 6A is a layout of an upper structure, FIG. 6B is a layout of a lower structure, FIG. 6C is a layout of a back-end structure, and FIG. 6D is a layout of a PDN structure. A primary difference between the first integrated circuit device 1000 and the second integrated circuit device 2000 is the numbers of transistors included in the upper and lower structures.

Referring to FIGS. 6A to 6D, the integrated circuit device 2000 may include a first SRAM unit SRAM1 and a second SRAM unit SRAM2. In some embodiments, the first SRAM unit SRAM1 and the second SRAM unit SRAM2 may have layouts symmetric with respect to the unit boundary therebetween as illustrated in FIGS. 6A to 6D.

Referring to FIG. 6A, the upper structure may include first and second pull-down transistors PD1 and PD2 and first and second gate path transistors PG1 and PG2 of each SRAM unit. A first upper transistor including a first upper gate electrode UG1 may be the first pull-down transistor PD1 of the first SRAM unit SRAM1, and a second upper transistor including a second upper gate electrode UG2 may be the first pull-down transistor PD1 of the second SRAM unit SRAM2. The first upper transistor may also include a first upper channel region UCH1 and first and second upper source/drain regions USD1 and USD2 contacting the first upper channel region UCH1. The second upper transistor may also include a second upper channel region UCH2 and third and fourth upper source/drain regions USD3 and USD4 contacting the second upper channel region UCH2.

A third upper transistor including a third upper gate electrode UG3 may be the second pull-down transistor PD2 of the first SRAM unit SRAM1, and a fourth upper transistor including a fourth upper gate electrode UG4 may be the second pull-down transistor PD2 of the second SRAM unit SRAM2. The third upper transistor may also include a third upper channel region UCH3 and fifth and sixth upper source/drain regions USD5 and USD6 contacting the third upper channel region UCH3. The fourth upper transistor may also include a fourth upper channel region UCH4 and seventh and eighth upper source/drain regions USD7 and USD8 contacting the fourth upper channel region UCH4.

A fifth upper transistor including a fifth upper gate electrode UG5 may be the first path gate transistor PG1 of the first SRAM unit SRAM1, and a sixth upper transistor including a sixth upper gate electrode UG6 may be the first path gate transistor PG1 of the second SRAM unit SRAM2. The fifth upper transistor may also include a fifth upper channel region UCH5 and a ninth upper source/drain region USD9 contacting the fifth upper channel region UCH5. In some embodiments, the second upper source/drain region USD2 of the first lower transistor may be shared with the fifth lower transistor, and the fifth upper channel region UCH5 may contact the second upper source/drain region USD2 of the first upper transistor. The sixth upper transistor may also include a sixth upper channel region UCH6 and a tenth upper source/drain region USD10 contacting the sixth upper channel region UCH6. In some embodiments, the fourth upper source/drain region USD4 of the second upper transistor may be shared with the sixth upper transistor, and the sixth upper channel region UCH6 may contact the fourth upper source/drain region USD4 of the second upper transistor.

A seventh upper transistor including a seventh upper gate electrode UG7 may be the second path gate transistor PG2 of the first SRAM unit SRAM1, and an eighth upper transistor including an eighth upper gate electrode UG8 may be the second path gate transistor PG2 of the second SRAM unit SRAM2. The seventh upper transistor may also include a seventh upper channel region UCH7 and an eleventh upper source/drain region USD11 contacting the seventh upper channel region UCH7. In some embodiments, the fifth upper source/drain region USD5 of the third upper transistor may be shared with the seventh upper transistor, and the seventh upper channel region UCH7 may contact the fifth upper source/drain region USD5 of the third upper transistor. The eighth upper transistor may also include an eighth upper channel region UCH8 and a twelfth upper source/drain region USD12 contacting the eighth upper channel region UCH8. In some embodiments, the seventh upper source/drain region USD7 of the fourth upper transistor may be shared with the eighth upper transistor, and the eighth upper channel region UCH8 may contact the seventh upper source/drain region USD7 of the fourth lower transistor.

Referring to FIG. 6B, the lower structure may include first and second pull-up transistors PU1 and PU2 of each SRAM unit. A first lower transistor including a first lower gate electrode LG1 may be the first pull-up transistor PU1 of the first SRAM unit SRAM1, and a second lower transistor including a second lower gate electrode LG2 may be the first pull-up transistor PU1 of the second SRAM unit SRAM2.

The first lower transistor may also include a first lower channel region LCH1 and first and second lower source/drain regions LSD1 and LSD2 contacting the first lower channel region LCH1. The second lower transistor may also include a second lower channel region LCH2 and third and fourth lower source/drain regions LSD3 and LSD4 contacting the second lower channel region LCH2.

A third lower transistor including a third lower gate electrode LG3 may be the second pull-up transistor PU2 of the first SRAM unit SRAM1, and a fourth lower transistor including a fourth lower gate electrode LG4 may be the second pull-up transistor PU2 of the second SRAM unit SRAM2. The third lower transistor may also include a third lower channel region LCH3 and fifth and sixth lower source/drain regions LSD5 and LSD6 contacting the third lower channel region LCH3. The fourth lower transistor may also include a fourth lower channel region LCH4 and seventh and eighth lower source/drain regions LSD7 and LSD8 contacting the fourth lower channel region LCH4.

The layout of the back-end structure of the second integrated circuit device 2000 illustrated in FIG. 6C may be similar to the layout of the back-end structure of the first integrated circuit device 1000 illustrated in FIG. 3C. Referring to FIG. 6C, each of the wordlines and the bit-lines may have a linear shape extending longitudinally in the second horizontal direction Y.

The layout of the PDN structure of the second integrated circuit device 2000 illustrated in FIG. 6D may be similar to the layout of the PDN structure of the first integrated circuit device 1000 illustrated in FIG. 3D. Referring to FIG. 6D, the first, fourth and sixth power rails PR1, PR4 and PR6 may be electrically connected to a second power having a second voltage (e.g., a source voltage Vss), and the second, third, fifth and seventh power rails PR2, PR3, PR5 and PR7 may be electrically connected to a first power having a first voltage (e.g., a drain voltage Vdd). In some embodiments, each of the power rails may have a linear shape extending longitudinally in the second horizontal direction Y, as illustrated in FIG. 6D.

The cross-sectional view of FIG. 7A may be similar to the cross-sectional view of FIG. 4A with primary difference being that the first power rail PR1 is electrically connected to the second power having a second voltage (e.g., a source voltage Vss), and the second and third power rails PR2 and PR3 are electrically connected to the first power having a first voltage (e.g., a drain voltage Vdd).

The cross-sectional view of FIG. 7B may be similar to the cross-sectional view of FIG. 4B with primary difference being that both a gate electrode (i.e., the fifth upper gate electrode UG5 and the sixth upper gate electrode UG6) electrically connected to the first wordline WL1, and a source/drain region (i.e., the ninth upper source/drain region USD9) electrically connected to the first bit-line BL1 are in the upper structure. Accordingly, the first wordline contact WLC1 and the third bit-line contact BLC3 may be provided higher than the second insulating layer 140.

Figure 7C:
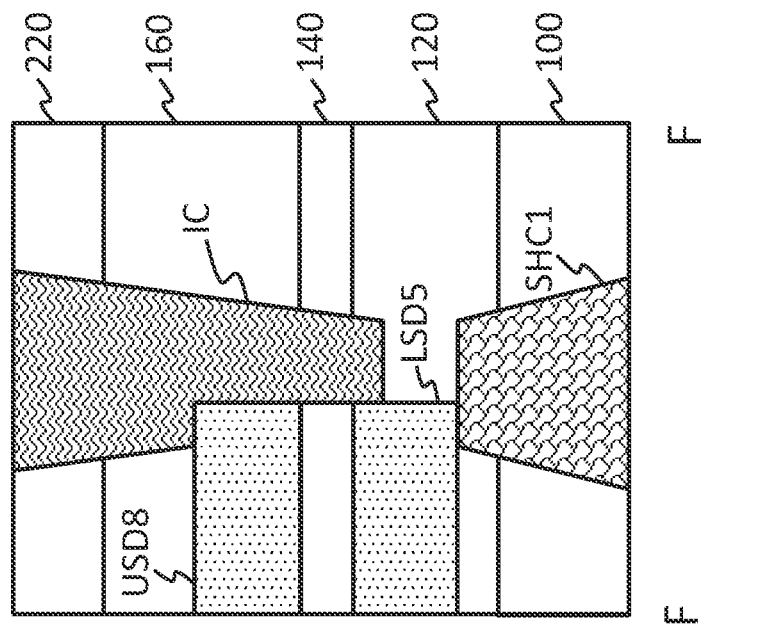
FIG. 7C shows cross-sectional views of the second integrated circuit device taken along a line E-E and a line F-F in FIG. 6B according to some embodiments.
Figure 7C:
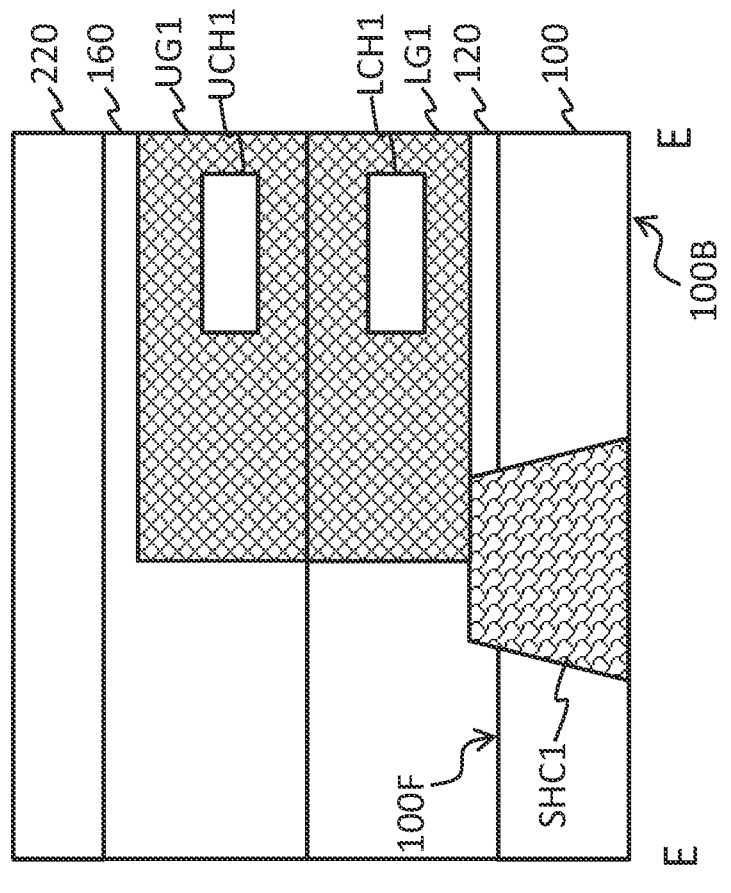

FIG. 7C shows cross-sectional views of the second integrated circuit device 2000 taken along a line E-E and a line F-F in FIG. 6B according to some embodiments. For simplicity of illustration, FIG. 7C shows only the lower structure and the upper structure of the second integrated circuit device 2000. Referring to FIG. 7C, the first shared contact SHC1 electrically connecting the first lower gate electrode LG1 of the first inverter to the fifth lower source/drain region LSD5 of the third inverter may be provided in the substrate 100. In some embodiments, the first lower gate electrode LG1 may contact the first upper gate electrode UG1 for electrical connection therebetween, as illustrated in FIG. 7C. In some embodiments, the first upper gate electrode UG1 may be spaced apart from the first lower gate electrode LG1 in the vertical direction Z, and a separate conductor electrically connecting the first upper gate electrode UG1 and the first lower gate electrode LG1 may be provided. The fifth lower source/drain region LSD5 may be electrically connected to the eighth upper source/drain region USD8 through a interconnection contact IC that extends through the second insulating layer 140.

Figure 8:
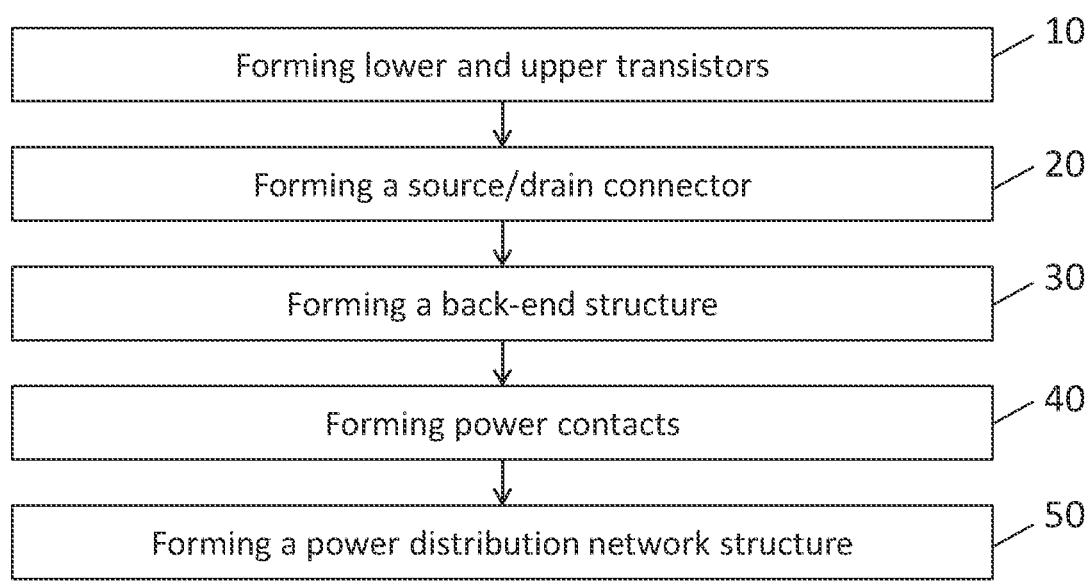
FIG. 8 is a flow chart of methods of forming the integrated circuit device according to some embodiments.

FIG. 8 is a flow chart of methods of forming the integrated circuit device 1000 according to some embodiments, and FIGS. 9 through 12 are cross-sectional views illustrating methods of forming the integrated circuit device 1000, specifically a portion illustrated in FIG. 4A, according to some embodiments.

Figure 9:
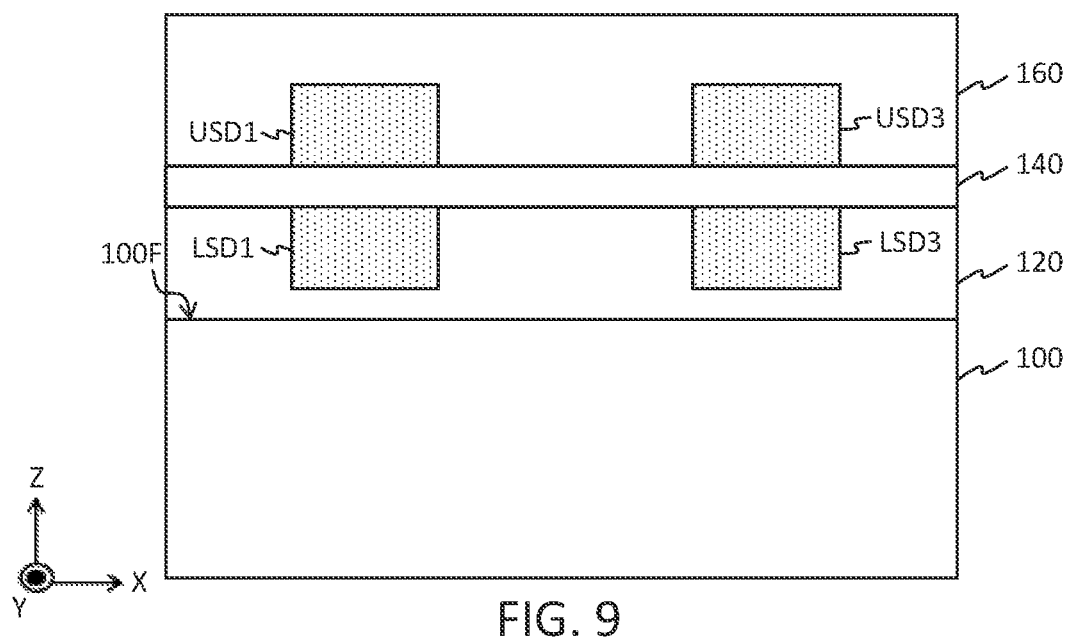
FIGS. 9 through 12 are cross-sectional views illustrating methods of forming the integrated circuit device according to some embodiments.

Referring to FIGS. 8 and 9, the methods may include forming lower transistors including first and third lower source/drain regions LSD1 and LSD3 and upper transistors including first and third upper source/drain regions USD1 and USD3 on a front side 100F of a substrate 100 (Block 10). First, second and third insulating layers 120, 140 and 160 may also be formed on the front side 100F of the substrate 100.

Figure 10:
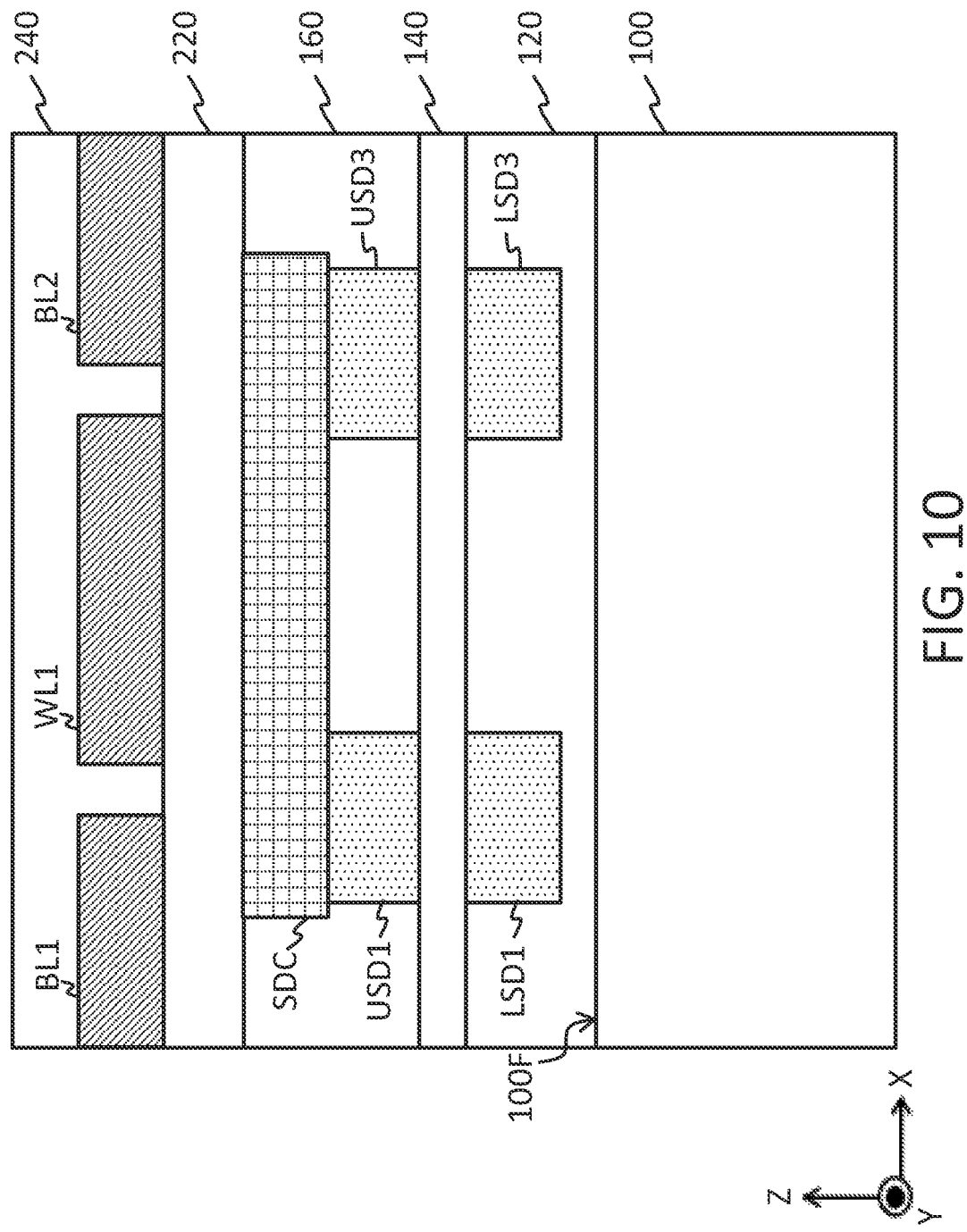

Referring to FIGS. 8 and 10, a source/drain connector SDC may be formed on the upper transistors (Block 20). The source/drain connector SDC may be formed in the third insulating layer 160 and may contact upper surfaces of the first and third upper source/drain regions USD1 and USD3. A fourth insulating layer 220 may be formed on the source/drain connector SDC, and then a back-end structure including the first wordline WL1 and first and second bit-lines BL1 and BL2 may be formed on the fourth insulating layer 220 (Block 30). The back-end structure may also include a fifth insulating layer 240.

Figure 11:
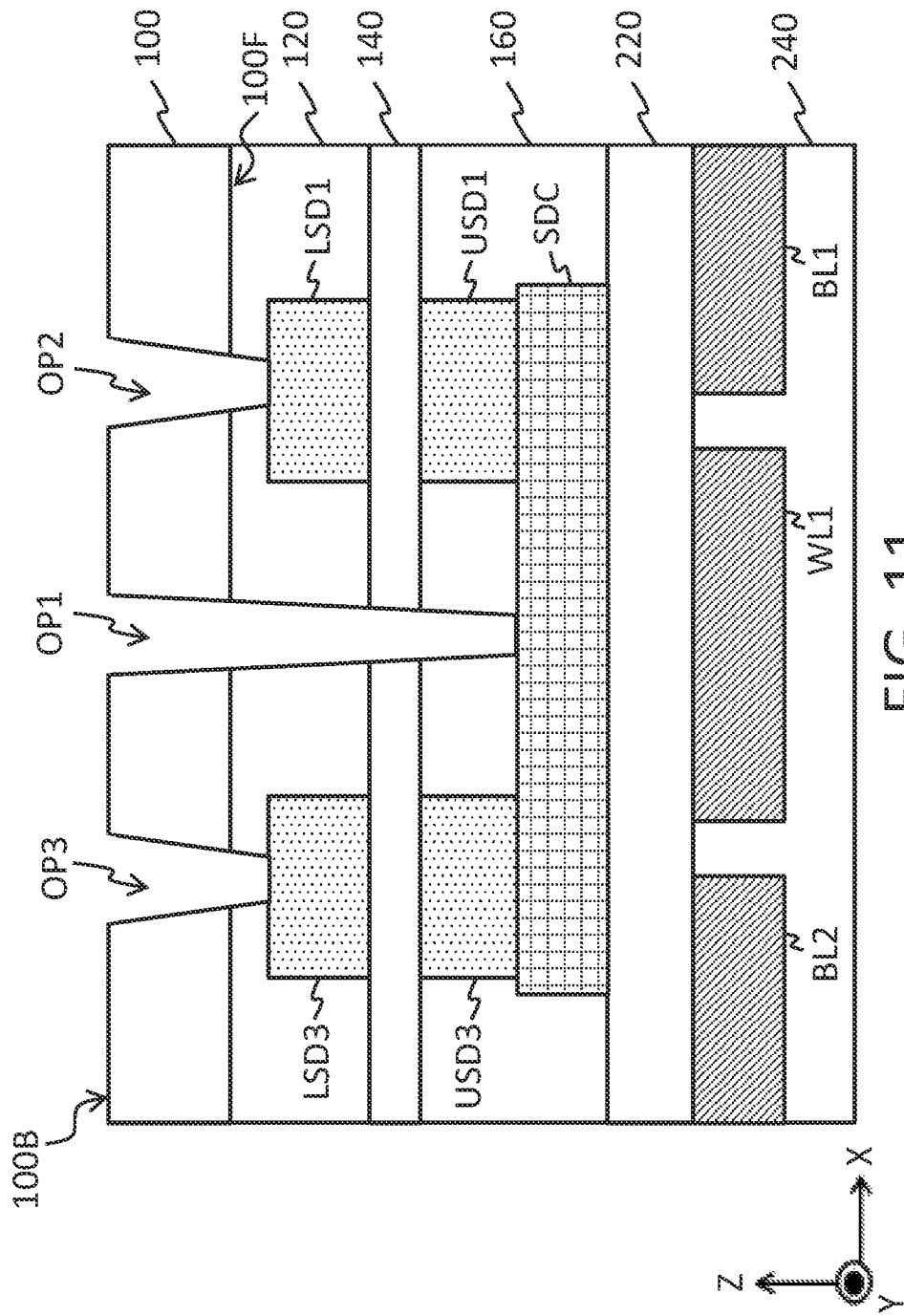

Referring to FIGS. 8 and 11, the structure shown in FIG. 10 may be turned around (e.g., flipped), and then a portion of the substrate 100 may be removed to reduce a thickness of the substrate 100. A thickness of the substrate 100 may be in a range of 50 nm to 100 nm after removing the portion of the substrate 100.

After removing the portion of the substrate 100, an etch process may be performed on a back side 100B of the substrate 100 to form first, second and third openings OP1, OP2 and OP3. In some embodiments, the first opening OP1 may extend through the substrate 100 and may expose the source/drain connector SDC, and the second and third openings OP2 and OP3 may extend through the substrate 100 and may expose the first and third lower source/drain regions LSD1 and LSD3, respectively.

Figure 12:
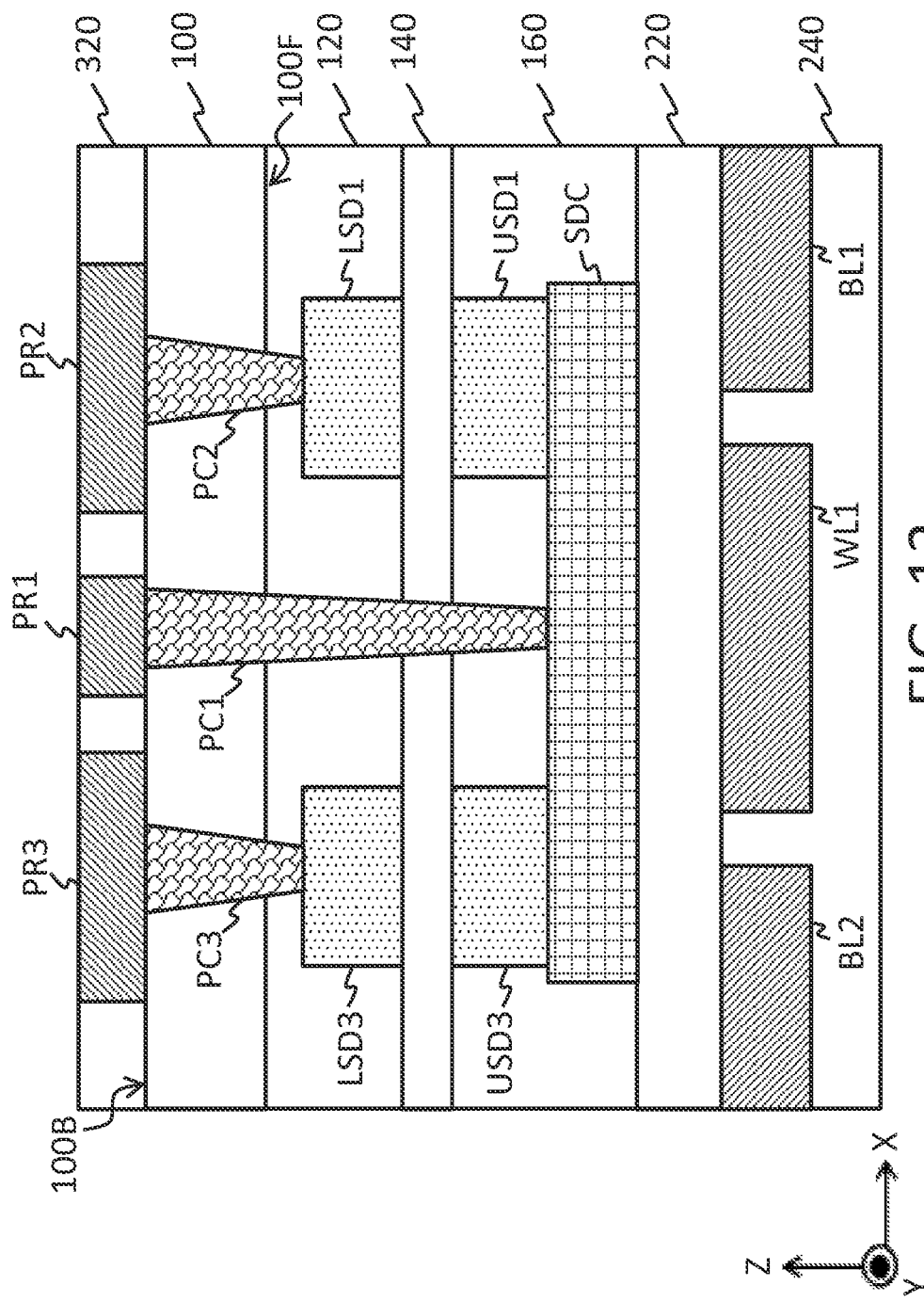

Referring to FIGS. 8 and 12, the methods may include forming first, second and third power contacts PC1, PC2 and PC3 in the first, second and third openings OP1, OP2 and OP3, respectively (Block 40). In some embodiments, the first shared contact SHC1 in FIG. 7C may be formed using the process of forming the first, second and third power contacts PC1, PC2 and PC3. The etch process of forming the first, second and third openings OP1, OP2 and OP3 may also form a shared contact opening in the substrate, in which the first shared contact SHC1 is formed subsequently, and then the first shared contact SHC1 may be formed while forming the first, second and third power contacts PC1, PC2 and PC3. For example, the first, second and third power contacts PC1, PC2 and PC3 and the first shared contact SHC1 may be formed by forming a conductive layer in the first, second and third openings OP1, OP2 and OP3 and the shared contact opening, and then removing a portion of the conductive layer, thereby separating the first, second and third power contacts PC1, PC2 and PC3 and the first shared contact SHC1 from each other.

Referring to FIGS. 8 and 12, a PDN structure may be formed on power contacts (e.g., the first, second and third power contacts PC1, PC2 and PC3) (Block 50). For example, power rails (e.g., the first, second and third power rails PR1, PR2 and PR3) may be formed on the power contacts and then an insulating layer (e.g., the sixth insulating layer 320) may be formed on the power rails for electrical isolation between those power rails.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. An integrated circuit device comprising:
   a static random access memory (SRAM) unit comprising a vertically-integrated first inverter on a substrate; and
   a power distribution network (PDN) structure comprising a first power rail and a second power rail, wherein the substrate extends between the first inverter and the PDN structure such that the first inverter extends vertically above a first surface of the substrate and the PDN structure extends vertically below a second surface of the substrate,
   wherein the first inverter comprises:
      a first upper transistor comprising a first upper source/drain region;
      a first lower transistor extending vertically between the substrate and the first upper transistor and comprising a first lower source/drain region, wherein the first upper source/drain region vertically overlaps the first lower source/drain region when viewed from the cross-sectional perspective;
      a first power contact extending through the substrate and electrically connecting the first upper source/drain region to the first power rail; and
      a second power contact extending through the substrate and electrically connecting the first lower source/drain region to the second power rail.

2. The integrated circuit device of claim 1,
   wherein the first upper transistor further comprises a second upper source/drain region, and the first lower transistor further comprises a second lower source/drain region,
   wherein the SRAM unit further comprises a path gate transistor comprising:
      a path gate channel region contacting one of the second upper source/drain region and the second lower source/drain region; and
      a path gate electrode,
   wherein the integrated circuit device further comprises a wordline electrically connected to the path gate electrode, and the substrate is between the wordline and the PDN structure.

3. The integrated circuit device of claim 2, wherein the path gate transistor further comprises a fifth source/drain region, and
   wherein the integrated circuit device further comprises a bit-line electrically connected to the fifth source/drain region, and the substrate is between the bit-line and the PDN structure.

4. The integrated circuit device of claim 3, wherein the wordline and the bit-line are spaced apart from each other in a first horizontal direction, and
   each of the wordline and the bit-line has a linear shape extending longitudinally in a second horizontal direction that is perpendicular to the first horizontal direction.

5. The integrated circuit device of claim 3, wherein lower surfaces of the wordline and the bit-line are at an equal height from the substrate.

6. The integrated circuit device of claim 1, wherein the first inverter extends vertically above the first surface of the substrate and the PDN structure extends vertically below the second surface of the substrate, which is opposite the first surface, when the SRAM unit and the PDN structure are viewed from a cross-sectional perspective.

7. An integrated circuit device comprising:
a first static random access memory (SRAM) unit comprising a first inverter on a substrate;
a power distribution network (PDN) structure comprising a first power rail and a second power rail, wherein the substrate extends between the first inverter and the PDN structure,
wherein the first inverter comprises:
a first upper transistor comprising a first upper source/drain region;
a first lower transistor between the substrate and the first upper transistor and comprising a first lower source/drain region, wherein the first upper source/drain region overlaps the first lower source/drain region in a vertical direction;
a first power contact extending through the substrate and electrically connecting the first upper source/drain region to the first power rail; and
a second power contact extending through the substrate and electrically connecting the first lower source/drain region to the second power rail; and
a second SRAM unit comprising a second inverter on the substrate, and the substrate extends between the second inverter and the PDN structure,
wherein the second inverter comprises:
a second upper transistor comprising a third upper source/drain region; and
a second lower transistor between the substrate and the second upper transistor and comprising a third lower source/drain region, wherein the third upper source/drain region overlaps the third lower source/drain region in the vertical direction, and
wherein the first power contact electrically connects the third upper source/drain region to the first power rail.

8. The integrated circuit device of claim 7, wherein the first upper source/drain region is spaced apart from the third upper source/drain region in a first horizontal direction, and the first power contact is between the first upper source/drain region and the third upper source/drain region, and
the integrated circuit device further comprises a source/drain connector that extends longitudinally in the first horizontal direction and electrically connects the first power contact to the first and third upper source/drain regions.

9. The integrated circuit device of claim 8, wherein the source/drain connector contacts upper surfaces of the first power contact and the first and third upper source/drain regions.

10. The integrated circuit device of claim 8, wherein each of the first power rail and the second power rail has a linear shape extending longitudinally in a second horizontal direction that is perpendicular to the first horizontal direction.

11. The integrated circuit device of claim 7, wherein the first upper source/drain region is spaced apart from the third upper source/drain region in a first horizontal direction,
the PDN structure further comprises a third power rail, and the second inverter further comprises a third power contact extending through the substrate and electrically connecting the third lower source/drain region to the third power rail, and
each of the first, second and third power rails has a linear shape extending longitudinally in a second horizontal direction that is perpendicular to the first horizontal direction, and the first power rail extends between the second and third power rails.

12. The integrated circuit device of claim 11, wherein the first power rail is between the second power rail and the third power rail, and
the first power rail is electrically connected to a first power source having a first voltage, and the second and third power rails are electrically connected to a second power source having a second voltage.

13. The integrated circuit device of claim 7, wherein the first inverter extends vertically above a first surface of the substrate and the PDN structure extends vertically below a second surface of the substrate, which is opposite the first surface, when the SRAM unit and the PDN structure are viewed from a cross-sectional perspective.

14. An integrated circuit device comprising:
a static random access memory (SRAM) unit comprising a first inverter and a third inverter on a substrate; and
a shared contact in the substrate,
wherein the first inverter comprises:
a first upper transistor comprising a first upper gate electrode; and
a first lower transistor between the substrate and the first upper transistor and comprising a first lower gate electrode that is electrically connected to the first upper gate electrode,
wherein the third inverter comprises:
a third upper transistor comprising a fifth upper source/drain region; and
a third lower transistor between the substrate and the third upper transistor and comprising a fifth lower source/drain region that is electrically connected to the fifth upper source/drain region, and
wherein the shared contact electrically connects the first lower gate electrode to the fifth lower source/drain region.

15. The integrated circuit device of claim 14, wherein both the first lower gate electrode and the fifth lower source/drain region contact the shared contact.

16. The integrated circuit device of claim 14, further comprising a power distribution network (PDN) structure that comprises a first power rail and a second power rail,
wherein the substrate extends between the first inverter and the PDN structure and between the third inverter and the PDN structure,
wherein the first upper transistor further comprises a first upper source/drain region, and the first lower transistor further comprises a first lower source/drain region, and
wherein the first inverter further comprises:
a first power contact extending through the substrate and electrically connecting the first upper source/drain region to the first power rail; and
a second power contact extending through the substrate and electrically connecting the first lower source/drain region to the second power rail.

17. The integrated circuit device of claim 16, wherein the first power rail and the second power rail are spaced apart from each other in a first horizontal direction, and
each of the first power rail and the second power rail has a linear shape extending longitudinally in a second horizontal direction that is perpendicular to the first horizontal direction.

18. A method of forming an integrated circuit device, the method comprising:
forming a first static random access memory (SRAM) unit comprising a first inverter and a second SRAM unit comprising a second inverter on a front side of a substrate,
wherein the first inverter comprises:

a first upper transistor comprising a first upper source/drain region; and a first lower transistor between the substrate and the first upper transistor and comprising a first lower source/drain region;

wherein the second inverter comprises:

a second upper transistor comprising a third upper source/drain region; and a second lower transistor between the substrate and the second upper transistor and comprising a third lower source/drain region;

forming a source/drain connector on the first upper source/drain region and the third upper source/drain region, wherein the source/drain connector electrically connects the first upper source/drain region to the third upper source/drain region;

performing an etch process on a back side of the substrate, thereby forming first and second openings that extend through the substrate;

forming a first power contact and a second power contact in the first opening and the second opening, respectively, wherein the first power contact is electrically connected to the source/drain connector, and the second power contact is electrically connected to the first lower source/drain region; and forming a power distribution network (PDN) structure on the first power contact and the second power contact, wherein the PDN structure comprises a first power rail electrically connected to the first power contact and a second power rail electrically connected to the second power contact.

19. The method of claim 18, wherein the source/drain connector contacts upper surfaces of the first upper source/drain region and the third upper source/drain region.

20. The method of claim 18, wherein the first power contact contacts the source/drain connector, and the second power contact contacts the first lower source/drain region.

21. The method of claim 18, wherein the first upper transistor further comprises a second upper source/drain region, and the first lower transistor further comprises a second lower source/drain region, wherein the first SRAM unit further comprises a path gate transistor comprising:

a path gate channel region contacting one of the second upper source/drain region and the second lower source/drain region; and a path gate electrode, and wherein the method further comprises forming a wordline on the source/drain connector before performing the etch process on the back side of the substrate, and the wordline is electrically connected to the path gate electrode.

22. The method of claim 18, wherein the first upper transistor further comprises a first upper gate electrode, and the first lower transistor further comprises a first lower gate electrode that is electrically connected to the first upper gate electrode, wherein the first SRAM unit further comprises a third inverter comprising:

a third upper transistor comprising a fifth upper source/drain region; and a third lower transistor between the substrate and the third upper transistor and comprising a fifth lower source/drain region that is electrically connected to the fifth upper source/drain region, wherein performing the etch process on the back side of the substrate comprises forming a shared contact opening that extends through the substrate, and the method further comprises forming a shared contact in the shared contact opening, and the shared contact electrically connects the first lower gate electrode to the fifth lower source/drain region.

23. The integrated circuit device of claim 18, wherein the first inverter extends vertically above a first surface of the substrate and the PDN structure extends vertically below a second surface of the substrate, which is opposite the first surface, when the SRAM unit and the PDN structure are viewed from a cross-sectional perspective.

* * * * *